US006350999B1

(12) United States Patent
Uenoyama et al.

(10) Patent No.: US 6,350,999 B1
(45) Date of Patent: Feb. 26, 2002

(54) ELECTRON-EMITTING DEVICE

(75) Inventors: Takeshi Uenoyama, Kyoto; Takao Tohda, Nara; Masahiro Deguchi, Osaka; Makoto Kitabatake, Nara; Kentaro Setsune, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/449,525

(22) Filed: Nov. 29, 1999

(30) Foreign Application Priority Data

Feb. 5, 1999 (JP) .......................................... 11-028246
Mar. 5, 1999 (JP) .......................................... 11-058195

(51) Int. Cl.[7] ..................... H01L 31/0328; H01L 33/00; H01L 31/00

(52) U.S. Cl. ....................... 257/191; 257/101; 257/103; 257/185; 313/309; 313/351

(58) Field of Search ................................ 257/101, 103, 257/185, 191; 313/309, 351

(56) References Cited

U.S. PATENT DOCUMENTS

| | | | | |
|---|---|---|---|---|
| 4,616,248 A | 10/1986 | Khan et al. | | |
| 4,967,242 A | * 10/1990 | Sonoda et al. | ................ | 357/22 |
| 5,670,798 A | * 9/1997 | Schetzina | .................... | 257/96 |
| 5,679,965 A | * 10/1997 | Schetzina | ................... | 257/103 |
| 5,773,920 A | * 6/1998 | Shaw et al. | ................. | 313/309 |
| 5,955,772 A | * 9/1999 | Shakouri et al. | ............ | 257/467 |
| 6,064,082 A | * 5/2000 | Kawai et al. | ............... | 257/192 |

FOREIGN PATENT DOCUMENTS

| | | | |
|---|---|---|---|
| JP | 64-31470 | * 2/1989 | ........... H01L/29/80 |
| JP | 1-179371 | * 7/1989 | ........... H01L/29/80 |
| JP | 3-291944 | * 12/1991 | ......... H01L/21/338 |
| JP | 7-249780 | * 9/1995 | ........... H01L/29/80 |
| JP | 8-96705 | 4/1996 | |
| JP | 9-199001 | 7/1997 | |
| JP | 9-320450 | 12/1997 | |
| JP | 9-330647 | 12/1997 | |

OTHER PUBLICATIONS

V.M. Bermudez et al., The Growth and Properties of A1 and A1N Films on GaN(0001)–(1x1), J. App. Phys. 79(1), Jan. 1, 1996, pp. 110–119.

J.L. Shaw et al., Graded Electron Affinity Electron Source, J. Vac. Sci. Technol. B 14(3), May/Jun. 1996 pp. 2072–2079.

* cited by examiner

*Primary Examiner*—Steven Loke
*Assistant Examiner*—Ori Nadav
(74) *Attorney, Agent, or Firm*—Eric J. Robinson; Nixon Peabody LLP

(57) ABSTRACT

In an electron-emitting device, an electron supplying layer for supplying electrons is composed of an n-GaN layer. An electron transferring layer for moving electrons toward the surface is composed of non-doped (intrinsic) $Al_xGa_{1-x}N$ ($0 \leqq x \leqq 1$) having a graded composition for the Al concentration x. A surface layer is composed of non-doped AlN having a negative electron affinity (NEA). The electron transferring layer composed of $Al_xGa_{1-x}N$ has a band gap which is enlarged nearly continuously from the electron supplying layer to the surface layer and a negative electron affinity or a positive electron affinity close to zero. If such a voltage V as to render the surface electrode side positive is applied, the band of $Al_xGa_{1-x}N$ is bent, whereby a current derived mainly from a diffused current flows from the electron supplying layer to the surface layer through the electron transferring layer. Thereby excellent electron emitting characteristic is obtained.

10 Claims, 18 Drawing Sheets

ELECTRON-EMITTING DEVICE

BACKGROUND OF THE INVENTION

The present invention relates to an electron-emitting device comprising a surface layer composed of a material having a negative or substantially negative electron affinity.

A conventional electron-emitting device has a structure in accordance with a hot cathode system (an electron gun system) in which hot electrons are emitted from a solid into a vacuum by heating, to a high temperature, a cathode composed of a refractory metal material such as tungsten (W) which is disposed in spaced opposing relation to an anode. As a recent electron beam source substituting for an electron gun, attention has been focused on an extremely small electron-emitting device of cold cathode type. As typical electron-emitting devices of this type, there have been reported a device of field emission type and a device of pn junction type having a coating of a low-work-function material on the surface thereof.

The electron-emitting device of field emission type comprises a conic emitter portion formed of a refractory metal material such as silicon (Si) or molybdenum (Mo) and a withdrawn electrode disposed in spaced relation to the emitter portion. A voltage is applied to the withdrawn electrode to produce a high electric field ($>1\times10^9$ V/m), which causes the emitter portion to emit electrons. The device of field emission type is advantageous in that it can be scaled down by using a micro-fabrication technique.

On the other hand, the electron-emitting device of pn junction type has a coating layer of a low-work-function material, such as cesium (Cs), on the surface of a p-type semiconductor layer, thereby producing a state with a negative electron affinity. The device is structured such that electrons are emitted into a vacuum from the p-type semiconductor layer with the application of a bias voltage to the device.

The characteristics equally required of the extremely small electron-emitting devices of cold cathode type are: easy emission of electrons with a relatively small operational voltage (e.g., an emitter material has a low electron affinity); easy control of the emitted electron beam; the chemically stable surface of the emitter portion owing to a stable emission property; and excellent wear resistance and excellent heat resistance.

However, the conventional electron-emitting devices mentioned above have the following disadvantages.

The device of field emission type has the disadvantage of a relatively high operational voltage because a high electric field is used to cause electron emission. The device also has the disadvantage of poor controllability of the amount of emitted current because the amount of emitted current is highly dependent on the configuration of the emitter portion and on the surface state and because it is difficult to form a large number of conic emitters with excellent uniformity.

The electron-emitting device of pn junction type using a semiconductor material is disadvantageous in terms of device stability and lifespan because the coating layer made of a low-work-function material, which is indispensable to the surface of the p-type semiconductor layer for achieving easy emission of electrons, is poor in stability.

SUMMARY OF THE INVENTION

It is therefore an object of the present invention to provide a novel electron-emitting device of previously unknown structure, which is operable with a low voltage and excellent in emission property, by using a materiel having a negative or substantially negative electron affinity close to zero and by providing means for efficiently supplying electrons to the surface layer serving as an electron-emitting portion.

A first electron-emitting device of the present invention comprises: a semiconductor layer functioning as an electron supplying layer; a surface layer disposed in spaced relation to the semiconductor layer, the surface layer being composed of a material having a negative electron affinity or a positive electron affinity close to zero; a graded composition layer interposed between the semiconductor layer and the surface layer, the graded composition layer having a varying composition such that the electron affinity decreases in a direction from the semiconductor layer toward the surface layer; and a surface electrode disposed on the surface layer, the surface electrode applying a voltage such that electrons are supplied from the semiconductor layer to an outermost surface of the surface layer.

In the arrangement, the graded composition layer as the region in which the electrons move has the electron affinity decreasing with approach toward the surface layer. Accordingly, the electrons are easily emitted from the surface layer having a negative electron affinity into a vacuum by applying a voltage between the semiconductor layer functioning as the electron supplying layer and the surface electrode and thereby supplying the electrons to the surface layer through the graded composition layer. Since a voltage of about 10 V is sufficient as the maximum voltage to be applied, though it varies depending on the device structure, there can be implemented an electron-emitting device operable with a low voltage and capable of emitting the electrons with high efficiency.

In the first electron-emitting device, the electrons can be supplied efficiently from the electron supplying layer to the surface layer by using a non-doped semiconductor material for the graded composition layer.

The first electron-emitting device preferably uses the structure in which at least a part of the graded composition layer has a band gap enlarged nearly continuously from the semiconductor layer to the surface layer. In the structure, the electrons are allowed to move smoothly in the graded composition layer.

In the first electron-emitting device, the surface layer preferably contains aluminum nitride (AlN). The arrangement allows the formation of the device capable of emitting electrons with high efficiency by using the characteristic of negative electron affinity of the AlN surface.

Preferably, the first electron-emitting device further comprises a coating layer disposed on the surface layer, the coating layer being composed of a material different from the material composing the surface layer. The coating layer can control electron emission and protect the surface layer.

In the first electron-emitting device, the coating layer preferably contains a material having a negative electron affinity or a positive electron affinity close to zero. In the arrangement, the property of efficient electron emission can be maintained, while electron emission can be controlled and the surface layer can be protected.

In the first electron-emitting device, the coating layer preferably contains aluminum nitride (AlN).

In the first electron-emitting device, a region including the graded composition layer and the surface layer is preferably composed of $Al_xGa_{1-x}N$ ($0\leqq x\leqq 1$) in which the proportion of Al increases with approach toward the outermost surface. The arrangement allows easy formation of the high-quality graded composition layer and surface layer.

In the first electron-emitting device, the surface electrode is preferably in Schottky contact with the surface layer. In the arrangement, the electrons can be supplied with excellent controllability from the electron supplying layer.

In the first electron-emitting device, the surface electrode preferably has first and second regions, an energy barrier between the surface layer and the second region being larger than an energy barrier between the surface layer and the first region. In the arrangement, the current of electrons can converge on the first region of the surface electrode and the density of the emitted current can be increased.

In the first electron-emitting device, the surface electrode preferably has a pattern for controlling the distribution of emitted electrons. As a result, a current of emitted electrons having a desired distribution can be generated with controllability.

The first electron-emitting device further comprises: an insulator layer overlying a part of the surface electrode; and an external electrode disposed on the insulating layer, the external electrode accelerating and controlling the electrons emitted from the surface layer to the outside. Consequently, there can be achieved an integrated acceleration/control mechanism for the current of emitted electrons.

A second electron-emitting device of the present invention comprises: a semiconductor layer functioning as an electron supplying layer; a surface layer disposed in spaced relation to the semiconductor layer, the surface layer being composed of a material having a negative electron affinity or a positive electron affinity close to zero; a multilevel superlattice layer interposed between the semiconductor layer and the surface layer, the multilevel superlattice layer being composed of a plurality of stacked layers for resonantly transmitting electrons supplied in a direction from the semiconductor layer toward the surface layer; and a surface electrode disposed on the surface layer, the surface electrode applying a voltage such that electrons are supplied from the semiconductor layer to an outermost surface of the surface layer.

In the arrangement, the electrons are efficiently transported from the semiconductor layer to the outermost surface of the surface layer via the subband formed in the multilevel superlattice layer with the application of the voltage to the surface electrode. Consequently, there can be obtained a device which emits electrons with high efficiency by merely applying a low voltage thereto.

In the second electron-emitting device, the multilevel superlattice layer is preferably composed of two mixed crystals each represented by $Al_xGa_{1-x}N$ ($0 \leqq x \leqq 1$), the two mixed crystals having different component ratios and being alternately stacked in layers. The arrangement allows easy formation of an excellent multilevel superlattice layer.

In the second electron-emitting device also, the surface layer preferably contains aluminum nitride (AlN).

Preferably, the second electron-emitting device also further comprises a coating layer disposed on the surface layer, the coating layer being composed of a material different from the material composing the surface layer.

In the second electron-emitting device also, the coating layer preferably contains a material having a negative electron affinity or a positive electron affinity close to zero.

In the second electron-emitting device also, the coating layer preferably contains aluminum nitride (AlN).

A third electron-emitting device of the present invention comprises: a semiconductor layer functioning as an electron supplying layer; a surface layer disposed in spaced relation to the semiconductor layer, the surface layer being composed of a material having a negative electron affinity or a positive electron affinity close to zero; an electron transferring layer interposed between the semiconductor layer and the surface layer, the electron transferring layer supplying electrons in a direction from the semiconductor layer toward the surface layer; and a surface electrode disposed in Schottky contact with at least a part of the surface layer, the surface electrode applying a voltage such that the electrons are supplied from the semiconductor layer to an outermost surface of the surface layer.

By applying the voltage between the semiconductor layer and the surface electrode in Schottky contact with at least the part of the surface layer, the electrons can be supplied with excellent controllability from the semiconductor layer to the surface layer through the electron transferring layer. As a result, there can be obtained an efficient electron-emitting device with excellent controllability.

In the third electron-emitting device also, the electron transferring layer preferably has a varying composition such that the electron affinity decreases in the direction from the semiconductor layer toward the surface layer.

In the third electron-emitting device also, the electron transferring layer preferably has a varying composition such that a band gap is enlarged in the direction from the semiconductor layer toward the surface layer.

In the third electron-emitting device also, the electron transferring layer is preferably composed of a multilevel superlattice layer composed of a plurality of stacked layers for resonantly transmitting the electrons supplied in the direction from the semiconductor layer toward the surface layer.

In the third electron-emitting device also, the surface layer preferably contains aluminum nitride (AlN).

In the third electron-emitting device also, a region including the electron transferring layer and the surface layer is preferably composed of $Al_xGa_{1-x}N$ ($0 \leqq x \leqq 1$) in which the proportion of Al increases with approach toward the outermost surface.

In the third electron-emitting device, the surface electrode preferably has: a first region disposed in contact with only a part of the surface layer, the first region occupying an area smaller than the area occupied by the semiconductor layer; and a second region disposed continuously from the first region, an energy barrier between the surface layer and the second region being larger than an energy barrier between the surface layer and the first region.

In that case, the second region preferably occupies an area larger than the area occupied by the first region and is preferably composed of a material more endurable to ion bombardment than the material composing the first region. The arrangement increases the durability of the electron-emitting device.

Alternatively, the electron-emitting device further comprises an insulator layer formed on the region of the surface layer other than the region thereof in contact with the first region of the surface electrode, wherein the second region of the surface electrode is provided extensively over a side surface of the insulator layer and a top surface of the insulator layer. In the arrangement, the current of electrons can converge on the first region from which the electrons are emitted readily so that a more efficient electron-emitting device is implemented.

In the third electron-emitting device, the second region of the surface electrode preferably has a thickness larger than the thickness of the first region.

A fourth electron-emitting device of the present invention comprises: a solid layer functioning as an electron control layer; a surface layer disposed on the solid layer, the surface layer being composed of a material having a negative electron affinity or a positive electron affinity close to zero; a surface electrode disposed in contact with the surface layer, the surface electrode applying a voltage between the solid layer and an outermost surface of the surface layer; an external electrode disposed in spaced relation to the surface electrode; and a sealing member for maintaining a space between the surface electrode and the external electrode under reduced pressure.

The electrons emitted from the surface layer into a space under reduced pressure through the solid layer for controlling the quantity of emitted electrons by adjusting the value of the applied voltage are accelerated with the positive voltage applied to the external electrode to reach the external electrode. In other words, the kinetic energy of the emitted electrons can be controlled by adjusting the value of the voltage supplied to the external electrode. Since the quantity of emitted electrons can be controlled with the voltage applied between the solid layer and the surface electrode, the current flowing to the external electrode disposed in spaced relation to the surface electrode can eventually be controlled. By thus controlling the quantity of emitted electrons by adjusting the value of the voltage applied between the solid layer and the surface electrode, accelerating the electrons in the space under reduced pressure, and collecting the electrons by the external electrode, it becomes possible to cause the fourth electron-emitting device to function as an element (vacuum transistor) capable of amplifying a signal and performing a switching operation.

Since the device is composed of the solid/surface layers from which electrons are emitted easily and adapted to accelerate the emitted electrons under reduced pressure, it has the advantages of high withstand voltage, small internal loss, and low-voltage driving.

In the fourth electron-emitting device, the solid layer may have a structure provided at least with: a semiconductor layer functioning as an electron supplying layer; and a graded composition layer interposed between the semiconductor layer and the surface layer, the graded composition layer having a varying composition such that the electron affinity decreases in a direction from the semiconductor layer toward the surface layer.

In the fourth electron-emitting device, the graded composition layer preferably has a varying composition such that a band gap is enlarged in the direction from the semiconductor layer toward the surface layer.

In the fourth electron-emitting device, at least a part of the graded composition layer preferably has a band gap enlarged nearly continuously from the semiconductor layer to the surface layer.

In the fourth electron-emitting device, a region including the graded composition layer and the surface layer is preferably composed of $Al_xGa_{1\times x}N$ ($0\leqq x\leqq 1$) in which the proportion of Al increases with approach toward the outermost surface.

In the fourth electron-emitting device, the solid layer may have a structure provided at least with: a semiconductor layer functioning as an electron supplying layer; and a multilevel superlattice layer interposed between the semiconductor layer and the surface layer, the multilevel superlattice layer being composed of a plurality of stacked layers for resonantly transmitting electrons supplied in a direction from the semiconductor layer toward the surface layer.

In the fourth electron-emitting device, the surface layer preferably contains aluminum nitride (AlN).

In the fourth electron-emitting device, the surface electrode preferably has: a first region disposed in contact with only a part of the surface layer, the first region occupying an area smaller than the area occupied by the semiconductor layer; and a second region disposed continuously from the first region, an energy barrier between the surface layer and the second region being larger than an energy barrier between the surface layer and the first region.

In the fourth electron-emitting device, the second region preferably occupies an area larger than the area occupied by the first region and is preferably composed of a material more endurable to ion bombardment than the material composing the first region.

Preferably, the fourth electron-emitting device further comprises an insulator layer formed on the region of the surface layer other than the region thereof in contact with the first region of the surface electrode, wherein the second region of the surface electrode is provided extensively over a side surface of the insulator layer and a top surface of the insulator layer.

DESCRIPTION OF THE PREFERRED EMBODIMENTS

The present invention relates to an electron-emitting device using a semiconductor material or an insulator material each having a negative electron affinity (NEA). Prior to the description of the individual embodiments of the present invention, a description will be given to the principle of the electron-emitting device using an NEA material (hereinafter referred to as "an NEA electron-emitting device").

Basic Structure and Principle of NEA Electron-Emitting Device

Figure 1:
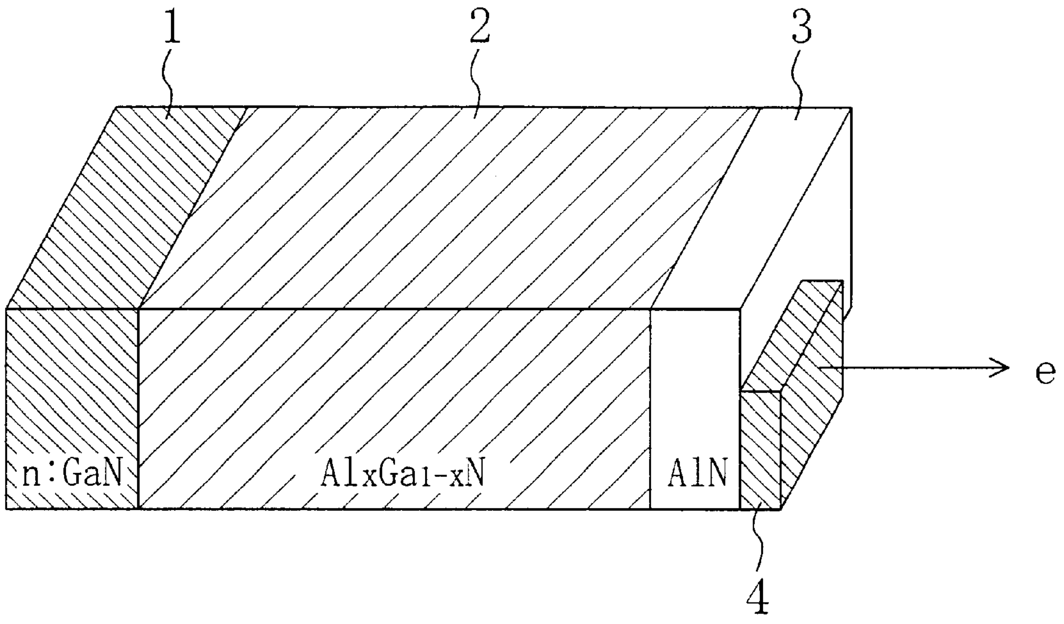
FIG. 1 is a perspective view showing a structure of an NEA electron-emitting device using AlN as an exemplary NEA material.

FIG. 1 is a perspective view showing a structure of the NEA electron-emitting device using aluminum nitride (AlN) as an exemplary NEA material. As shown in FIG. 1, the NEA electron-emitting device of the present invention comprises: an electron supplying layer 1 for supplying electrons; an electron transferring layer 2 for moving the electrons supplied from the electron supplying layer 1 toward a solid surface; a surface layer 3 composed of the NEA material; and a surface electrode 4 for applying a voltage such that the electrons are moved from the electron supplying layer 1 to the surface layer 3.

Although the electron supplying layer 1 is composed of n-type GaN (n-GaN), the electron transferring layer 2 for smoothly moving the electrons from the electron supplying layer 1 to the surface layer 3 is composed of $Al_xGa_{1-x}N$ (where x is a variable varying nearly continuously from 0 to 1) having a graded composition in which the Al concentration ratio x varies continuously, the surface layer 3 is composed of AlN which is an intrinsic NEA material, and the surface electrode 4 is composed of metal such as platinum (Pt), the structures of the individual components of the NEA electron-emitting device according to the present invention are not limited thereto.

A description will be given to electron affinity which is an important property for the basic characteristics of the present invention and to a structure of the electron transferring layer necessary for smoothly moving the electrons.

(1) Electron Affinity

In a semiconductor material, electron affinity indicates an energy value required to extract electrons present at the edge of the conduction band into a vacuum, which is peculiar to the material. Hereinafter, the concept of negative electron affinity (NEA) will be described.

Figure 2A:
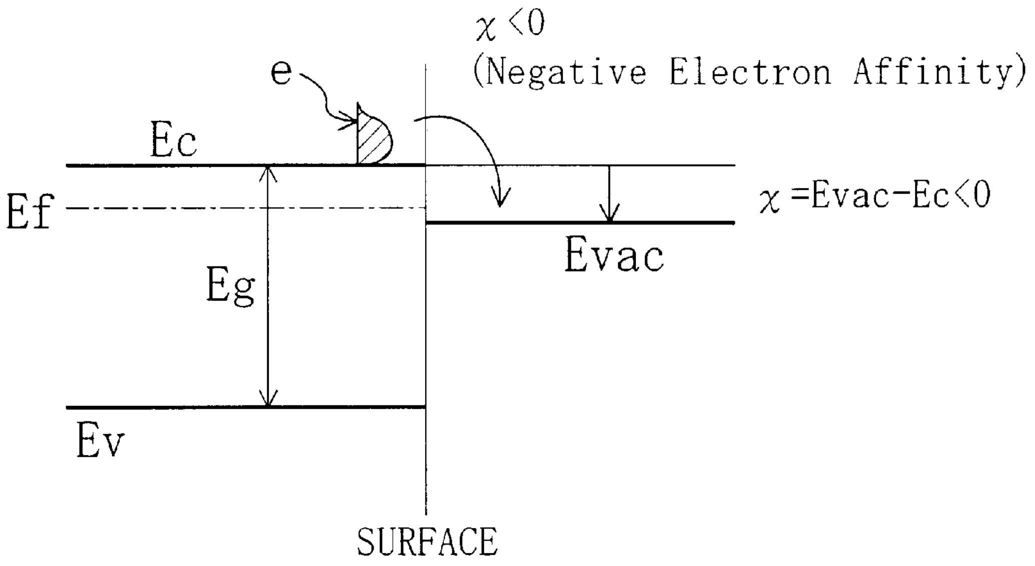
FIGS. 2(*a*) and 2(*b*) are energy band diagrams showing the respective energy states of a semiconductor having a negative electron affinity and a semiconductor having a positive electron affinity.
Figure 2B:
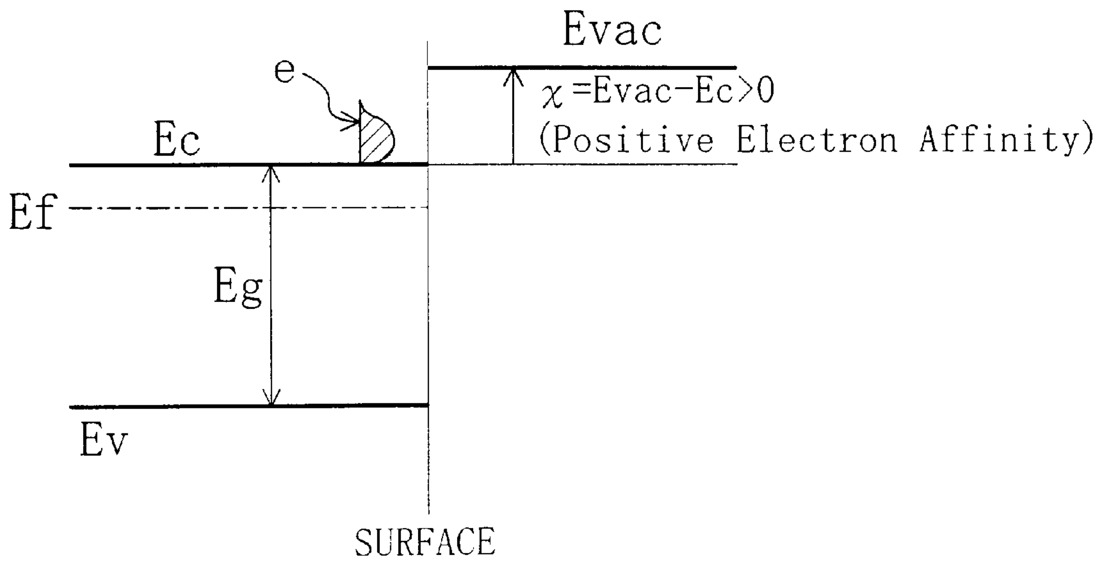

FIGS. 2(*a*) and 2(*b*) are energy band diagrams showing the respective energy states of a semiconductor material having a negative electron affinity and a semiconductor material having a positive electron affinity. As shown in FIG. 2(*b*), if the Fermi level of the semiconductor is Ef, the energy level at the edge of the conduction band is Ec, the energy level at the edge of the valence band is Ev, the band gap is Eg, and the vacuum level is Evac, the electron affinity $\chi$ in a typical semiconductor is expressed as $\chi$=Evac−Ec>0. In short, the semiconductor has a positive electron affinity. However, there are states in which $\chi$=Evac−Ec<0 depending on the type of the semiconductor, as shown in FIG. 2(*a*). Accordingly, such a semiconductor as AlN has a negative electron affinity.

Since an energy barrier having a magnitude of $\chi$ exists in a semiconductor having a positive electron affinity, as shown in FIG. 2(*b*), the energy equivalent to $\chi$ should be given to extract electrons present at the edge of the conduction band into a vacuum. To cause electron emission, therefore, it is normally necessary to supply energy to electrons by heating or applying a high electric field and thereby cause the electrons to tunnel through the energy barrier.

On the other hand, no energy barrier exists for electrons present at the edge of the conduction band of a semiconductor surface having a negative electron affinity, as shown in FIG. 2(*a*), so that the electrons are easily emitted into a vacuum. Therefore, no extra energy is required to extract electrons present at the surface of the semiconductor into a vacuum.

Even if the value $\chi$ of the electron affinity is positive, however, it is possible to emit a certain quantity of electrons with low energy, though with reduced efficiency, so long as $\chi$ is sufficiently small because the electrons present in the conduction band of a semiconductor material normally have an energy distribution as shown in FIGS. 2(*a*) and 2(*b*). In the present specification, therefore, it is defined that the "NEA materials" include not only a material having a negative electron affinity (intrinsic NEA material as shown in FIG. 2(*a*)) but also a material having a positive electron affinity the value $\chi$ of which is sufficiently low to be judged substantially zero (pseudo NEA material).

As exemplary NEA materials previously known, there are structures in which semiconductors such as gallium arsenide (GaAs), gallium phosphide (GaP), and silicon (Si) have thin coatings of low-work-function materials such as cesium (Cs), cesium oxide (Cs—O), cesium antimonide (Cs—Sb), and rubidium oxide (Rb—O) on the respective surfaces thereof. However, these structures cannot retain NEA states unless they are in a high vacuum since the surface adsorbing layers are poor in stability. As exemplary NEA materials not using surface adsorbing layers, there are diamond and AlN. In addition, $Al_xGa_{1-x}N$ having a high Al concentration x also has negative electron affinity, as will be described below.

Figure 3:
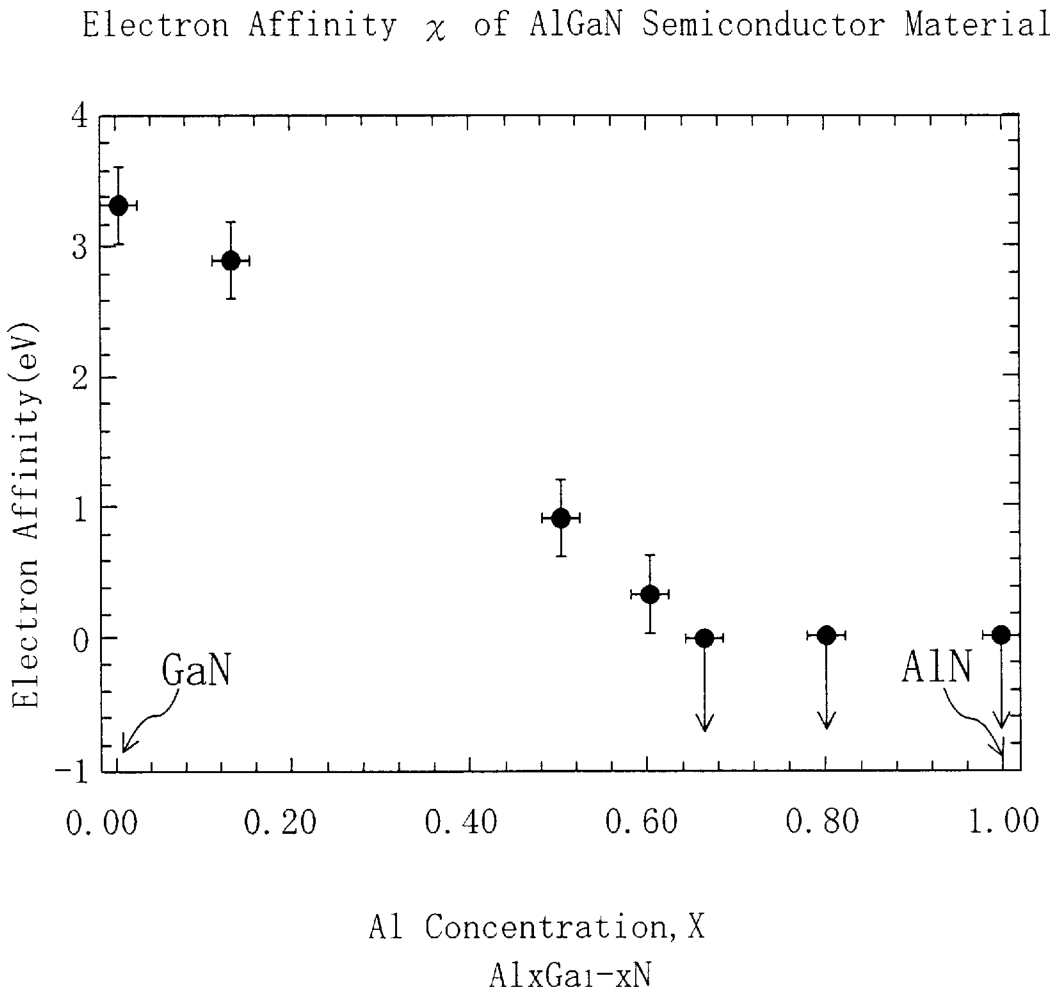
FIG. 3 shows data indicative of the result of measuring the electron affinity of $Al_xGa_{1-x}N$.

FIG. 3 shows data indicative of the result of measuring the electron affinity of an $Al_xGa_{1-x}N$ semiconductor material. In the drawing, the horizontal axis represents the Al concentration x in $Al_xGa_{1-x}N$. It is to be noted that the Al concentration x indicates the ratio of the content of Al to the total contents of Ga and Al in $Al_xGa_{1-x}N$, not the ratio of the amount of Al to the total amount of $Al_xGa_{1-x}N$ which will hold true hereinafter. As shown in the drawing, the electron affinity of GaN, which is $Al_xGa_{1-x}N$ when x=0, is 3.3 eV or less and shows the characteristic of positive electron affinity. The value of electron affinity decreases as the Al concentration x increases to become approximately zero or negative in the range of x>0.65. Accordingly, the electron affinity of AlN, which is $Al_xGa_{1-x}N$ when x=1, is negative.

(2) Electron Transferring Layer

It may be considered that the use of the foregoing material having a negative electron affinity or a positive electron affinity which is substantially zero for the surface layer of an electron-emitting device from which electrons are emitted is effective for efficient emission of electrons. However, no electron exists in the conduction band of a typical NEA material in the state of equilibrium. Therefore, it is necessary to efficiently supply electrons to the surface layer composed of a material from which electrons are emitted easily in one way or another.

For this purpose, there can be considered an exemplary structure having a middle layer (electron transferring layer 2) in which the value of electron affinity decreases such that electrons are effectively supplied from the electron supplying layer 1 (having a positive electron affinity) in which a large number of electrons exist to the surface layer 3 (having a negative electron affinity) in the NEA state through the middle layer.

Figure 4A:
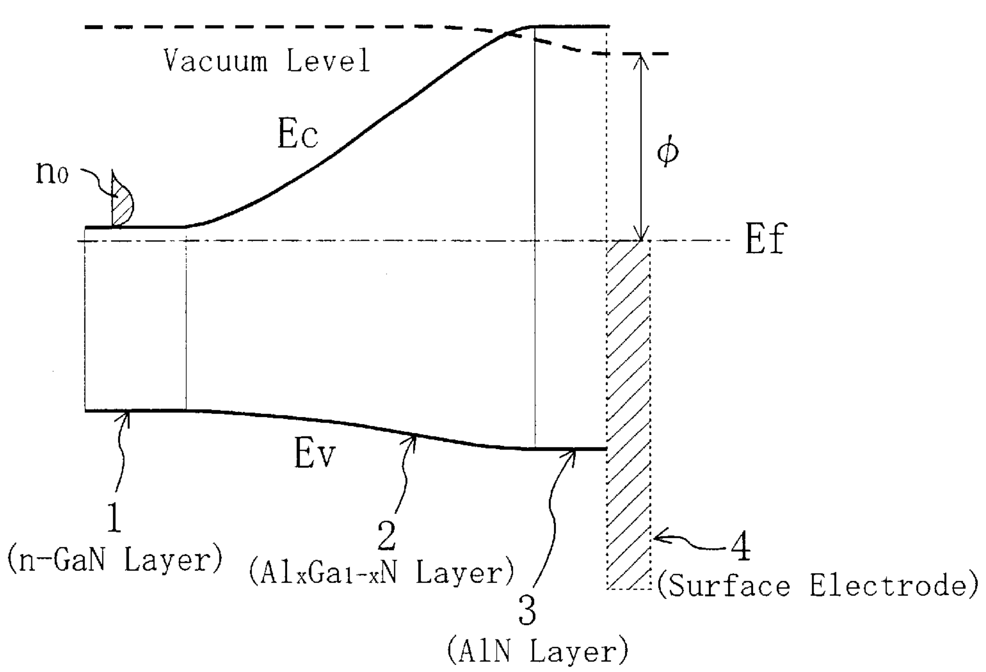
FIGS. 4(*a*) and 4(*b*) are energy band diagrams showing the respective energy states in individual layers in the no-load state and upon the application of a voltage V between a surface electrode and an electron supplying layer.
Figure 4B:
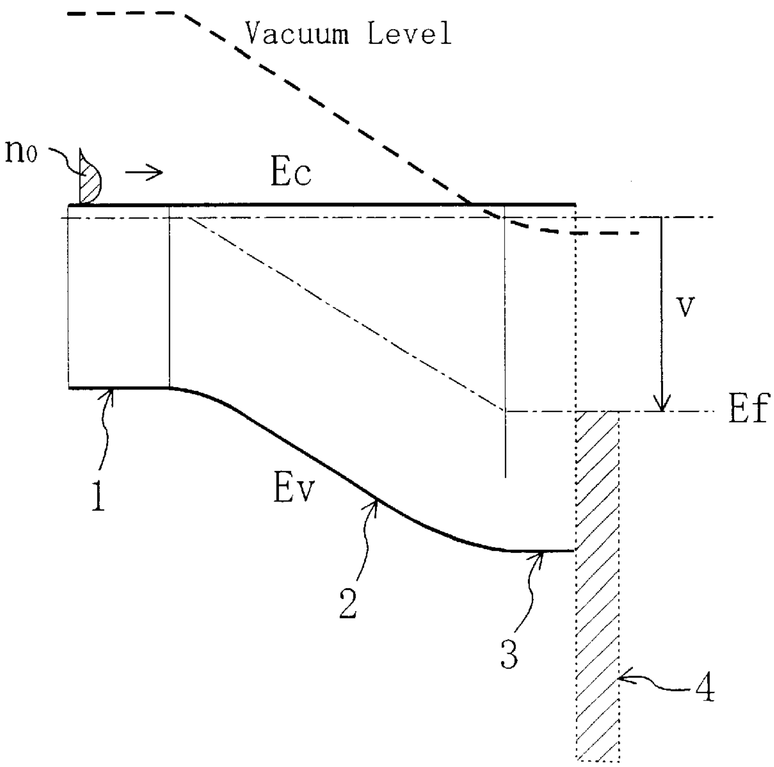

FIGS. 4(*a*) and 4(*b*) are energy band diagrams when no voltage is applied between the electron supplying layer 1 and the surface electrode 4 (in the state of equilibrium) and when a forward bias of a voltage V is applied therebetween in the exemplary structure shown in FIG. 1 composed of the electron supplying layer 1, the electron transferring layer 2, the surface layer 3, and the surface electrode 4. As described above, the electron transferring layer 2 is composed of one selected from materials in which the electron affinity $\chi$ decreases toward the surface. The electron transferring layer 2 can be implemented by properly selecting among the materials and varying the composition ratio of the selected material.

In the exemplary structure, GaN doped with an n-type dopant (carrier density: $4\times10^{18}/cm^3$ or less) is used for the electron supplying layer 1, a non-doped $Al_xGa_{1-x}N$ layer ($0\leqq x\leqq 1$) having a graded composition is used for the electron transferring layer 2, an AlN layer is used for the surface layer 3, and Pt is used for the surface electrode 4. In the portion of the electron transferring layer 2 composed of $Al_xGa_{1-x}N$ having a graded composition which is in contact with GaN composing the electron supplying layer 1, x=0 is satisfied, i.e., Al is not contained. In the portion of the electron transferring layer 2 which is in contact with AlN composing the surface layer 3, x=1 is satisfied, i.e., Ga is not contained. In the middle portion of the electron transferring layer 2 located between the portions in contact with GaN and AlN, a graded composition is achieved such that the value of x increases, i.e., the Al content increases with approach toward the surface. In the structure, the electron affinity of the electron transferring layer 2 composed of $Al_xGa_{1-x}N$ is positive in the portion in contact with the electron supplying layer 1, decreases with approach toward the surface as the Al concentration increases as shown in FIG. 3, and becomes negative in the portion in contact with the surface layer 3. Accordingly, the electron affinity of the electron transferring layer decreases nearly continuously from the electron supplying layer 1 to the surface layer.

Figure 5:
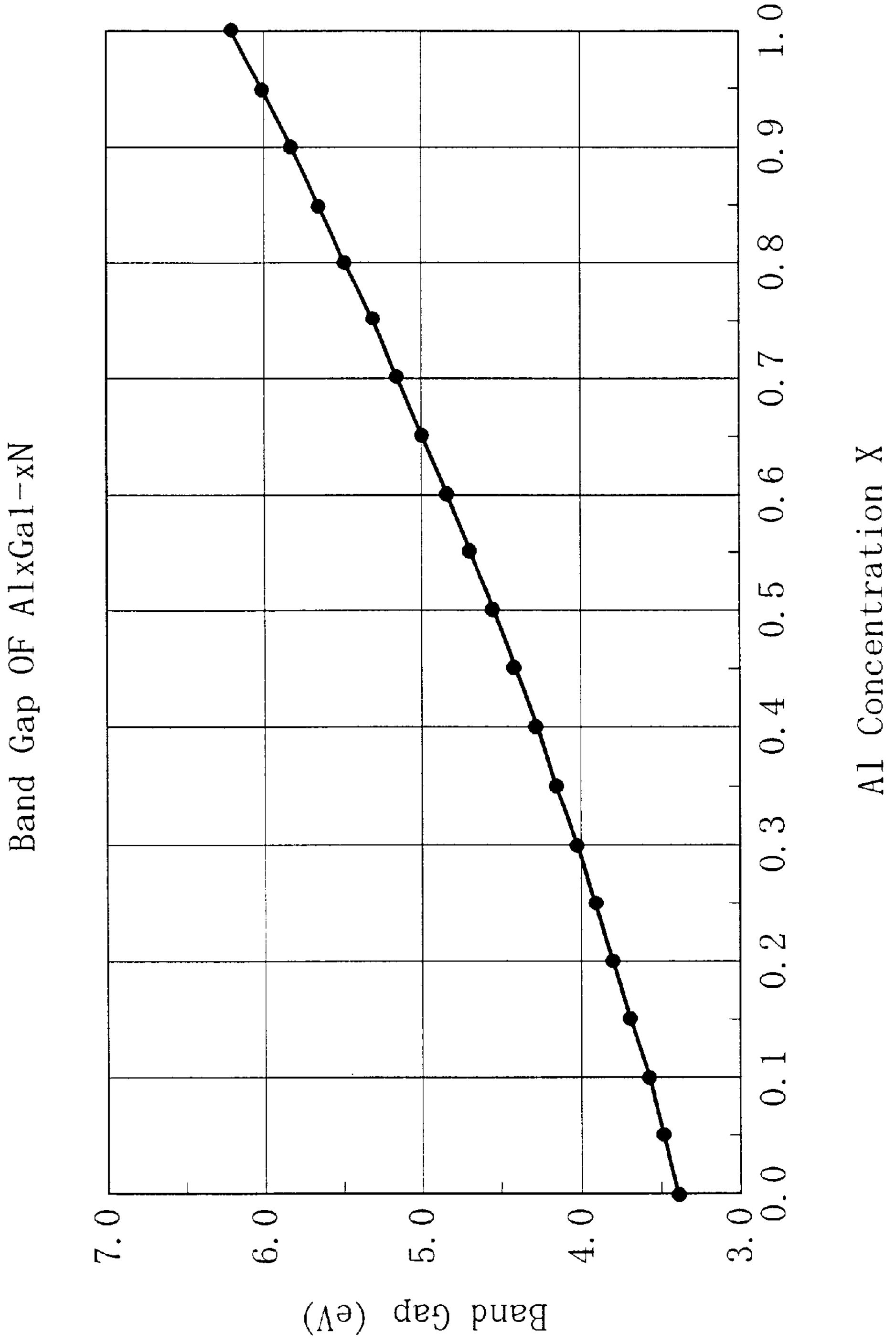
FIG. 5 shows the dependence of the band gap of $Al_xGa_{1-x}N$ on the Al concentration.

In the case of using $Al_xGa_{1-x}N$ having a graded composition for the electron transferring layer 2, it can also be considered that the band gap is enlarged continuously in the foregoing structure. FIG. 5 illustrates the dependence of the band gap of $Al_xGa_{1-x}N$ ($0\leqq x\leqq 1$) on the Al concentration. In the drawing, the horizontal axis represents the Al concentration x and the vertical axis represents the band gap Eg (eV) in the composition. As shown in FIG. 5, the value Eg of $Al_xGa_{1-x}N$ increases as x increases not strictly linearly but nearly linearly. Therefore, x=0 is satisfied in the portion of $Al_xGa_{1-x}N$ composing the electron transferring layer, as in the present exemplary structure, which is in contact with GaN composing the electron supplying layer 1, i.e., the band gap is the same as that of GaN (Eg=3.4 eV), while x=1 is satisfied in the portion of $Al_xGa_{1-x}N$ in contact with AlN composing the surface layer 3, i.e., the band gap is the same as that of AlN (Eg=6.2 eV). In the middle portion located therebetween, the composition is graded such that the value x increases, i.e., the Al concentration increases with approach toward the surface. Consequently, the band gap of the electron transferring layer 2 composed of $Al_xGa_{1-x}N$ is enlarged nearly continuously from the electron supplying layer 1 to the surface layer as the Al concentration increases. Since the $Al_xGa_{1-x}N$ semiconductor is a mixed crystal, such a structure can be implemented with a single-crystal thin film epitaxially grown by varying the composition of a raw material.

In the state of equilibrium shown in FIG. 4(*a*), a large number of electrons exist in the conduction band of the electron supplying layer I but are prevented from reaching the outermost surface since the energy level is high at the edge of the conduction band of the surface layer 3. If a forward bias is applied to such a structure (a positive voltage is applied to the surface electrode), on the other hand, the energy band is bent as shown in FIG. 4(*b*). As a result, the electrons present in the electron supplying layer 1 move toward the surface layer 3 due to the graded concentration and the graded potential. Thus, a current of electrons flows. Since $Al_xGa_{1-x}N$ composing the electron transferring layer 2 and AlN composing the surface layer 3 are non-doped, the electrons injected from the electron supplying layer 1 into the electron transferring layer 2 and surface layer 3 are allowed to move without being captured by holes or the like for recombination. By imparting a continuously graded composition to the electron transferring layer 2, an energy barrier presenting an obstacle to the movement of the electrons is prevented from being formed at the edge of the conduction band, which is advantageous in terms of efficiently transmitting the electrons to the surface.

By using the $Al_xGa_{1-x}N$ layer having a graded composition as the electron transferring layer 2, the electrons can be moved efficiently from the n-GaN layer having a positive electron affinity to the surface layer 3 (AlN) having a negative electron affinity. The electrons thus injected into the electron transferring layer 2 and surface layer 3 can be extracted easily into a vacuum since the surface layer is in the NEA state.

A comparison will be made between the basic structure of the present invention shown in FIG. 4 and the conventionally reported NEA device of pn junction type.

Figure 23A:
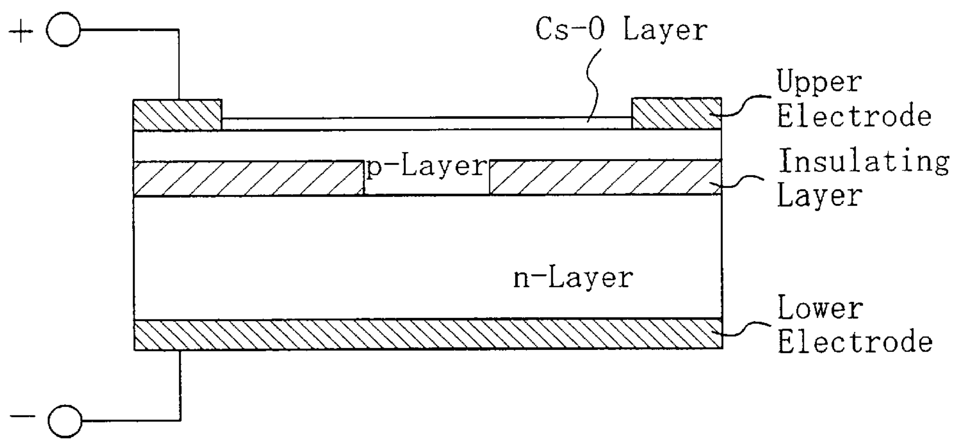
Fig. 23(a) Prior Art
FIG. 23(*a*) is a cross-sectional view showing a structure of an NEA device of junction type which has been reported hitherto and FIG. 23(*b*) is an energy band diagram showing the energy state thereof upon the application of a voltage.
Figure 23B:
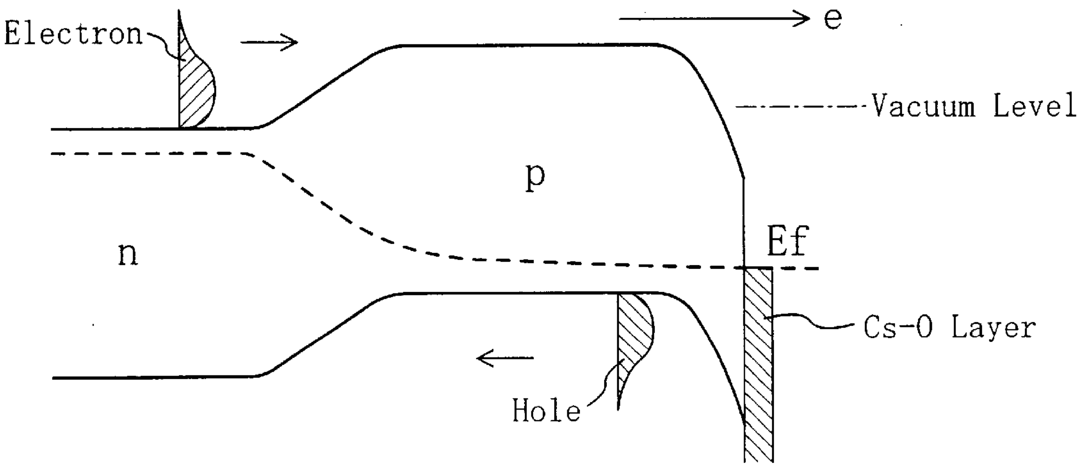
Fig. 23(b) Prior Art

FIG. 23(*a*) shows a cross-sectional structure of the NEA device of pn junction type using a surface adsorbing layer and FIG. 23(*b*) is an energy band diagram of the device upon the application of a forward bias thereto. It may be considered that the portion of the structure corresponding to the electron supplying layer of FIG. 4 is composed of n-type GaAs (n-type semiconductor layer), that the portion of the structure corresponding to the electron transferring layer of FIG. 4 is composed of p-type GaAs (p-type semiconductor layer), and that the portion of the structure corresponding to the surface layer is composed of a Cs—O adsorbing layer. In this case, none of the n-type GaAs layer, p-type GaAs layer, and Cs—O layer forms an NEA material by itself. However,the NEA state is effectively produced on the surface since the energy level at the edge of the conduction band of the p-type semiconductor becomes higher than the vacuum level due to the bending of the energy band in a near-surface portion when junctions are formed between the n-type and p-type GaAs layers and between the p-type GaAs layer and the Cs—O layer. Therefore, the electrons can be extracted into a vacuum by injecting the electrons from the n-type layer and supplying them to the p-type semiconductor surface to which Cs—O is adsorbed.

To extract electrons from the surface of the structure in the NEA state, however, the relationship between the semiconductor layer used as a base material and the surface adsorbing layer is important. If a non-doped intrinsic semiconductor layer is used instead of the p-type semiconductor layer, for example, the NEA state is not achieved even in the presence of the surface adsorbing layer.

The following is the differences between the structure according to the present invention and the conventional structure, which are obtained from the comparison.

In contrast to the conventional structure in which the NEA state is achieved based on the relationship between the p-type semiconductor layer, which is not composed of an intrinsic NEA material (not a pseudo NEA material), and the surface adsorbing layer, the present invention is advantageous in that the conductivity type of the semiconductor layer is not limited to p-type since the surface layer itself has a negative electron affinity or a positive electron affinity close to zero and an unstable surface adsorbing layer need not be provided. In contrast to the conventional structure in which a current of holes irrelevant to electron emission flows in the device due to the p-type layer used therein, only a current of electrons flows in the structure according to the present invention since the electron transferring layer is composed of a non-doped layer. As a result, an extremely efficient device is obtained since the injected electrons are no more lost through recombination with the holes and the rate of the current of emitted electrons to a device current is increased.

By thus forming the electron-emitting device comprising a semiconductor layer functioning as an electron supplying layer as shown in FIG. 4, a graded composition layer having a graded composition such that the electron affinity decreases with approach toward the surface layer, which is deposited on the semiconductor layer, and a surface layer composed of a material having a negative electron affinity or a positive electron affinity close to zero, it becomes possible to easily supply electrons to the surface in the NEA state (not a pseudo NEA state) by the action of the graded composition layer and extract the electrons into a vacuum.

Although the description has been given to the exemplary structure in which the composition of the electron transferring layer varies continuously, the present invention is not limited thereto. Even when the composition of the electron transferring layer varies stepwise or slightly discontinuously, there should be no problem unless the variations present large obstacles to the movement of the electrons. The effects of the present invention can be achieved so long as the composition varies such that the electron affinity of the electron transferring layer generally gradually decreases with approach toward the surface.

Although the description has been given to the structure in which the electron affinity of the electron transferring layer 2 is controlled by imparting a continuously graded composition thereto till the surface layer 3 is reached and electrons are supplied efficiently from the semiconductor layer 1 to the surface layer 3, the structure of the electron transferring layer 2 for achieving such an effect is not limited thereto.

By way of example, a description will be given to the structure using a semiconductor represented by $Al_xGa_{1-x}N$ as the electron transferring layer 2, similarly to the foregoing exemplary structure. In the present exemplary structure, however, the maximum value of x is smaller than 1.

Figure 6A:
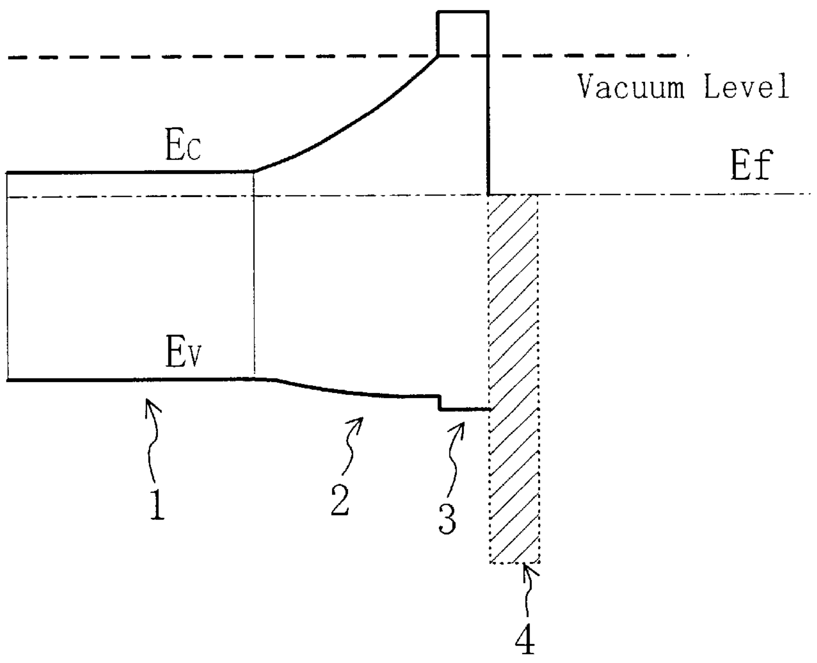
FIGS. 6(*a*) and 6(*b*) are energy band diagrams showing the energy states of an NEA electron-emitting device of single barrier type in the no-load state and upon the application of a voltage.
Figure 6B:
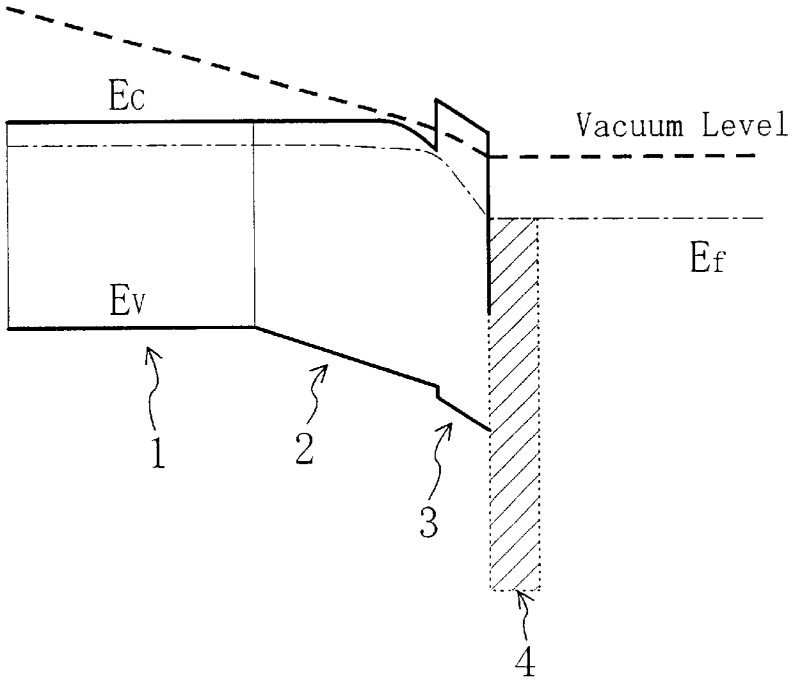

FIGS. 6(*a*) and 6(*b*) are energy band diagrams showing the energy states of an NEA electron-emitting device using $Al_xGa_{1-x}N$ ($0 \leqq x \leqq y$ and $y<1$) as an electron transferring layer in the state of equilibrium and upon the application of a forward bias thereto. In the present exemplary structure, a non-doped $Al_xGa_{1-x}N$ layer ($0 \leqq x \leqq y$ and $y<1$) functioning as the electron transferring layer 2 is formed on the electron supplying layer 1 (n-GaN) and then an AlN layer is further stacked as the surface layer 3 thereon, as shown in FIG. 6(*a*). In such a structure, an energy level discontinuity occurs at the interface between the electron transferring layer 2 and the surface layer 3. Although the value of an energy barrier in the conduction band is determined by the Al concentration y (maximum value of x) in the $Al_xGa_{1-x}N$ layer used as the electron transferring layer, the electrons injected from the electron supplying layer cannot be moved efficiently to the surface layer 3 if the Al concentration y is excessively large. In the present exemplary structure, therefore, y is preferably in the range of $0.5 \leqq y \leqq 0.8$.

When a forward bias is applied between the electron supplying layer and the surface electrode (a positive voltage is applied to the surface electrode), as shown in FIG. 6(*b*), the energy bands of the electron transferring layer and surface layer bend depending on the value of the applied voltage. As a result, the electrons move from the electron supplying layer toward the surface layer 3 due to the graded concentration and the graded potential, as stated previously. In this case, if the thickness of the AlN layer used as the surface layer 3 is small to a degree and the height of an energy barrier formed in the conduction band is small to a degree, the electrons having reached the interface between the electron transferring layer and the surface layer are allowed to tunnel through the energy barrier to move to the outermost surface. As a result, the electrons can be extracted into a vacuum from the surface layer composed of a material having a negative electron affinity or a positive electron affinity close to zero. The thickness of the surface layer through which the electrons can tunnel cannot be limited in terms of a trade-off between itself and the thickness of the electron transferring layer or the Al composition ratio but is approximately 10 nm or less.

Thus, the electrons can also be moved efficiently from the n-GaN layer having a positive electron affinity to the surface layer having a negative electron affinity even when the graded composition $Al_xGa_{1-x}N$ layer having the discontinuous energy barrier in the conduction band is used as the electron transferring layer. The electrons thus injected into the electron transferring layer and surface layer can be extracted easily into a vacuum since the surface layer is in the NEA state. Although the description has been given hitherto to the structure in which the electron affinity of the electron transferring layer 2 is controlled by imparting a graded composition thereto and electrons are efficiently supplied from the semiconductor layer 1 to the surface layer 3, the structure for achieving such an effect is not limited thereto.

Figure 7:
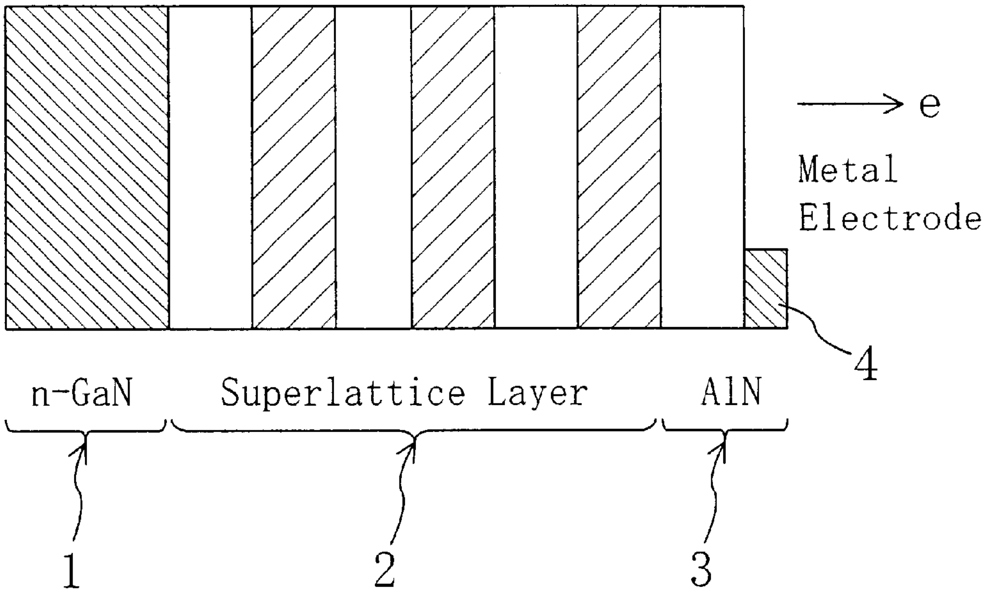
FIG. 7 diagrammatically shows a structure of an electron-emitting device having, as an electron transferring layer, a multilevel superlattice portion composed of two types of superlattice layers alternately stacked and having different Al concentrations each represented by $Al_xGa_{1-x}N$.

For example, FIG. 7 is a view diagrammatically showing a structure of an electron-emitting device using, as the electron transferring layer 2, a superlattice layer composed of two types of alternately stacked semiconductor layers (e.g., GaN layers and AlN layers) each represented by $Al_xGa_{1-x}N$ and having different Al concentrations. The electron-emitting device of this type is so structured as to resonantly transmit the electrons supplied from the electron supplying layer 1 via the subband formed in the conduction band of the superlattice layer and efficiently move them to the surface layer 3 by composing the electron transferring layer 2 of an appropriate number of pairs of alternately stacked layers each having an appropriate composition and an appropriate thickness.

The electron supplying layer 1 may be composed of, e.g., n-GaN, similarly to the structure. As a parameter for each type of layers used in the electron transferring layer, Al concentration ratio x is preferably $0 \leqq x \leqq 0.2$ for one type of layers and $0.6 \leqq x \leqq 1$ for the other type of layers. Each type of layers has a thickness of about 5 to 10 nm but the thickness is not limited thereto. Preferably, the two types of layers are alternately stacked in two to five pairs. Typically, the surface layer 3 is stacked on the electron transferring layer 2. However, in the case where the outermost surface layer of the layer composed of a superlattice structure, which is used as the electron transferring layer, is composed of a material having a negative electron affinity or a positive electron affinity close to zero, such as AlN, the layer functions equivalently to the surface layer so that it is possible to omit the formation of a new surface layer.

Figure 8A:
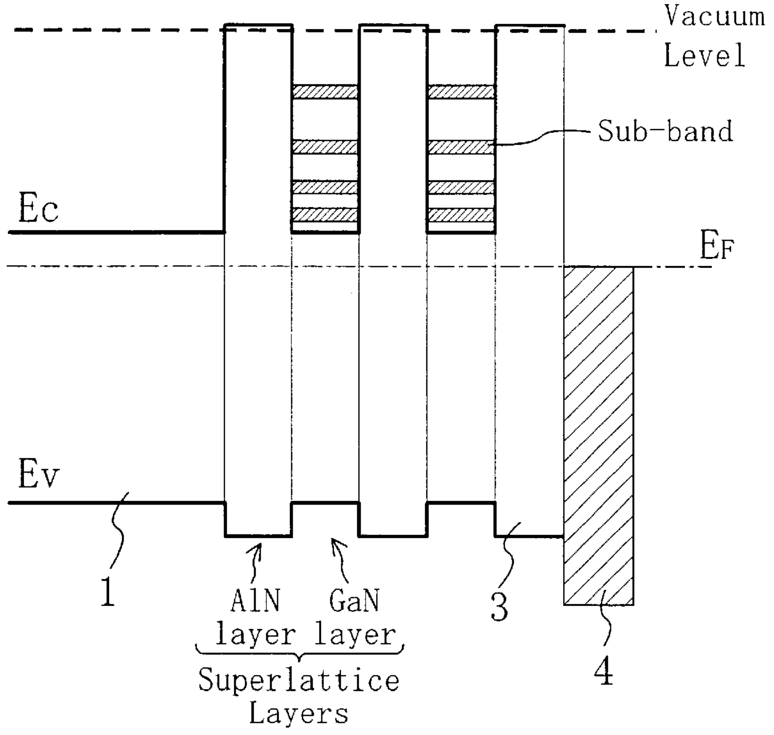
FIGS. 8(*a*) and 8(*b*) are energy band diagrams showing the energy states of an NEA electron-emitting device of multilevel superlattice type in the no-load state and upon the application of a voltage.
Figure 8B:
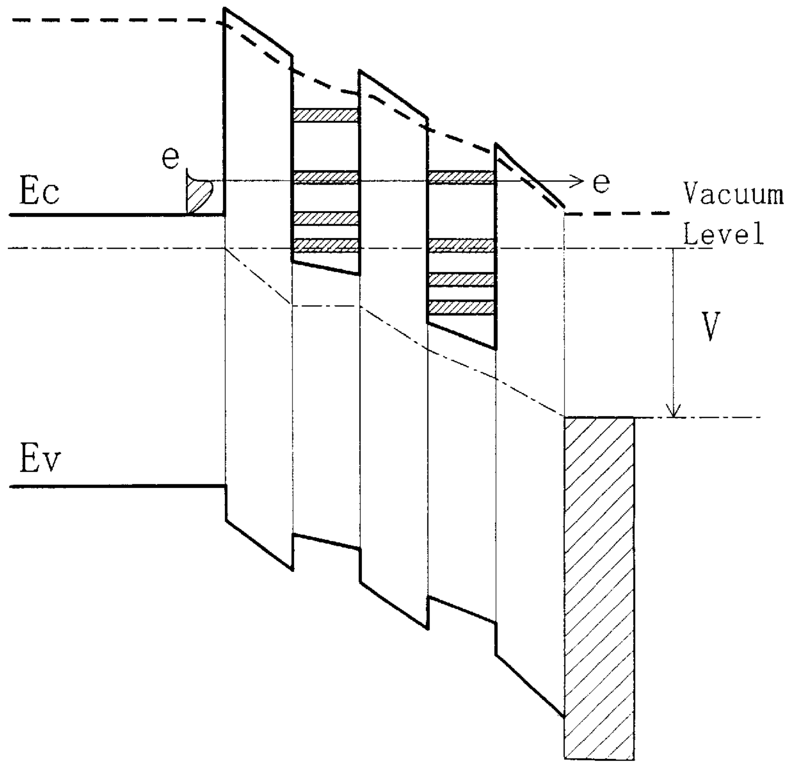

FIGS. 8(*a*) and 8(*b*) are energy band diagrams showing the energy states of the NEA electron-emitting device using the superlattice layer as the electron transferring layer in the state of equilibrium and upon the application of a forward bias. In the present exemplary structure, as shown in FIG. 8(*a*), two pairs of non-doped AlN layers and non-doped GaN layers are alternately stacked on the electron supplying layer 1 (n-GaN), followed by an AlN layer further formed thereon as the surface layer 3. In such a structure, a subband with a discontinuous energy level is formed in the superlattice layer of the electron transferring layer 2, as shown in FIG. 8(*a*). When a forward bias is applied between the electron supplying layer and the surface electrode (a positive voltage is applied to the surface electrode), the energy band of the superlattice layer bends depending on the value of the applied voltage, as shown in FIG. 8(*b*). By applying an optimum voltage, the allowable energy levels of adjacent quantum well portions come to coincide so that the electrons are resonantly transmitted via the subband to easily move within the superlattice layer. As a result, the electrons supplied from the electron supplying layer and resonantly transmitted by the electron transferring layer composed of a multilayer superlattice structure come to have an energy level equal to or higher than the vacuum level in the vicinity of the surface layer so that they are easily emitted from the surface layer into a vacuum. In this case, the applied voltage which allows the electrons to be emitted from the surface layer has a discrete value determined by the structure of the superlattice layer and exhibits dependence on the applied voltage different from that observed in the foregoing exemplary structure.

By thus forming the electron-emitting device comprising the semiconductor layer functioning as the electron supplying layer, the multilevel superlattice layer composed of alternately stacked layers having different compositions that have been deposited on the semiconductor layer, and the surface layer composed of a material having a negative electron affinity or a positive electron affinity close to zero, as shown in FIG. 7, electrons can easily be supplied to the surface in the NEA state and extracted into a vacuum by the action of the superlattice layer.

Next, a description will be given to each of the embodiments of an electron-emitting device obtained by applying the foregoing basic structure of the present invention.

Embodiment 1

Figure 9:
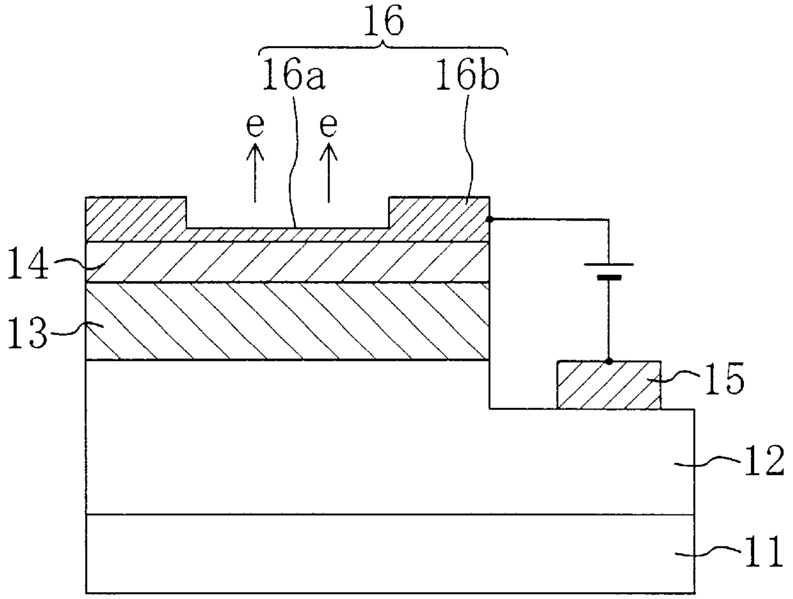
FIG. 9 is a cross-sectional view showing a structure of the NEA electron-emitting device in a first embodiment of the present invention.

FIG. 9 is a cross-sectional view showing a structure of an NEA electron-emitting device in a first embodiment of the present invention. As shown in the drawing, the NEA electron-emitting device of the present embodiment comprises: a sapphire (monocrystalline alumina) substrate 11; an n-GaN layer 12 provided on the sapphire substrate 11 to function as the electron supplying layer; an $Al_xGa_{1-x}N$ layer 13 which is a graded composition layer having a composition varying nearly continuously and provided on the n-GaN layer 12 to function as the electron transferring layer; and an AlN layer 14 provided on $Al_xGa_{1-x}N$ layer 13 to function as the surface layer. The NEA electron-emitting device further comprises: a lower electrode 15 provided on the n-GaN layer 12; and a surface electrode 16 provided on the AlN layer 14 to be in Schottky contact therewith. The $Al_xGa_{1-x}N$ layer 13 has a graded composition such that the Al concentration x is approximately 0 at the interface between itself and the n-GaN layer 12 and approximately 1 at the interface between itself and the AlN layer 14. The surface electrode 16 in the present embodiment is composed of a metal film having a single composition (e.g., nickel (Ni), titanium (Ti), or platinum (Pt)) and has a first region 16*a* with a small thickness (5 to 10 nm) and a second region 16*b* with a large thickness (100 nm or larger) surrounding the first region 16*a*.

Since the electron-emitting device of the present embodiment has substantially the same structure as the basic exemplary structure of the NEA electron-emitting device shown in FIG. 1, the electrons supplied from the n-GaN layer 12 (electron supplying layer) can be moved with excellent controllability within the $Al_xGa_{1-x}N$ layer 13 (electron transferring layer) and emitted efficiently into a vacuum from the AlN layer 14 (surface layer) with the application of a forward bias, as described above. At this time, some of the electrons naturally flow into the surface electrode 16 but they can be extracted primarily from the first region 16*a* with a small thickness of the surface electrode 16 by properly selecting a material for the surface electrode 16 and determining the thicknesses and areas of the first and second regions.

A method of manufacturing the NEA electron-emitting device of the present embodiment will be described below.

First, a GaN buffer layer (not shown) is formed on the sapphire substrate 11 by MOCVD by causing a reaction between trimethylgallium (TMG) and ammonium ($NH_3$). Next, the n-GaN layer 12 as the electron supplying layer is formed by adding silane ($SiH_4$) to a similar reaction gas. Subsequently, the supply of $SiH_4$ as a dopant gas is halted and trimethylaluminum (TMA) is then introduced to initiate the formation of the $Al_xGa_{1-x}N$ layer 13 by gradually increasing the amount of Al added. At some midpoint in the process of forming the $Al_xGa_{1-x}N$ layer 13, the amount of TMG supplied is gradually reduced, thereby continuously forming the $Al_xGa_{1-x}N$ layer 13 with a high Al concentration. By eventually setting the Al concentration x at 1, i.e., setting the Ga concentration at 0, the AlN layer 14 as the surface layer can be formed continuously from the $Al_xGa_{1-x}N$ layer 13. During the process, the reaction temperature for growing the $Al_xGa_{1-x}N$ layer 13 with high quality may also be varied gradually. By the technique, the n-GaN layer 12 as the electron supplying layer, the $Al_xGa_{1-x}N$ layer 13 as the electron transferring layer, and the AlN layer 14 as the surface layer can be formed continuously and with high quality. In the present embodiment, the thicknesses of the n-GaN layer, the $Al_xGa_{1-x}N$ layer, and the AlN layer are 4 $\mu$m, 0.07 $\mu$m, and 0.01 $\mu$m, respectively.

It should be noted that the methods of forming the GaN layer, the $Al_xGa_{1-x}N$ layer, and the AlN layer are not limited to the foregoing. They can also be formed by using MBE or like process instead of MOCVD. It is also possible to form the $Al_xGa_{1-x}N$ layer having a graded composition in which the Al concentration becomes lower with approach toward the bottom and higher with approach toward the top by, e.g., epitaxially growing a thin Al layer on the GaN layer.

Next, the lower electrode 15 is formed on the n-GaN layer 12 as the electron supplying layer. Since sapphire used for the substrate is an insulator, an electrode cannot be provided on the back side of the sapphire substrate 11. Accordingly, the AlN layer and the n-GaN layer 12 are etched to a certain depth from the surface thereof to partially expose the n-GaN layer 12 such that the lower electrode 15 (material: Ti/Al) is formed by vacuum vapor deposition on the surface of the n-GaN layer exposed by the etching process.

Further, the surface electrode 16 is formed on the AlN layer 14 as the surface layer. The material thereof is properly selected but Pt, Ni, Ti, or the like is preferably used. The method of forming the surface electrode 16 is not particularly limited but electron beam vapor deposition is normally used. Preferably, the thickness of the first region 16*a* of the surface electrode 16 functioning as the electron-emitting portion is minimized in order to enhance the efficiency of electron emission. For this reason, the first and second regions 16*a* and 16*b* may be formed individually in different steps during the formation of the whole surface electrode 16. In the present embodiment, the thicknesses of the first and second regions are 5 nm and 200 nm, respectively.

The diameters of the first and second regions are $\phi$20 $\mu$m and $\phi$50 $\mu$m, respectively.

A forward bias of about 2 to 10 V was applied between the lower electrode and the surface electrode in the NEA electron-emitting device with the structure of the first embodiment, with the result that a current of emitted electrons of about $10^2$ to $10^3$ (A/cm$^2$) was observed depending on the applied voltage.

Even when the first region 16*a* is not provided, i.e., when the center portion of the surface electrode 16 is a hollow space, it is possible to emit electrons, though with reduced efficiency.

Embodiment 2

The NEA electron-emitting device with the structure of the first embodiment only has the function of emitting electrons into a vacuum and does not have the function of collecting the current of emitted electrons. By providing an electrode serving as an anode adjacent the NEA electron-emitting device, the emitted electrons can be accelerated/collected, as shown in FIG. 10.

Figure 10:
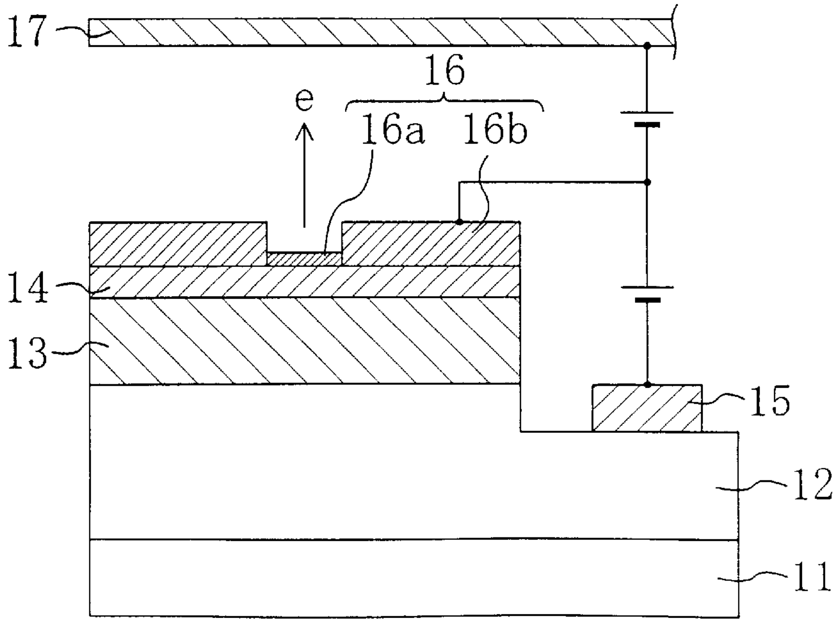
FIG. 10 is a cross-sectional view showing a structure of the NEA electron-emitting device in a second embodiment of the present invention.

FIG. 10 is a cross-sectional view showing a structure of the NEA electron-emitting device in a second embodiment of the present invention. As shown in the drawing, the present embodiment has an anode electrode 17 disposed in spaced opposing relation to the surface layer in addition to the structure of the first embodiment. By applying a proper bias voltage to the anode electrode 17, the current of emitted electrons can be controlled easily. If a fluorescent material or the like has been applied previously to the surface of the anode, light emission due to irradiation with an electron beam can be achieved. This allows the formation of a display device such as a display using the light emission.

Although the anode 17 has been disposed at a position spatially disconnected from the NEA electron-emitting device in the present embodiment, the position thereof is not limited thereto. It is also possible to integrate the anode electrode 17 into the NEA electron-emitting device by using an insulating structure.

Embodiment 3

Although the AlN layer 14 has been used as the surface layer in the first embodiment, $Al_xGa_{1-x}N$ in the range of $0.65 \leqq x \leqq 1$ can also be used for the surface layer since $Al_xGa_{1-x}N$ is an NEA material if the Al concentration x in $Al_xGa_{1-x}N$ is 0.65 or more.

Figure 11:
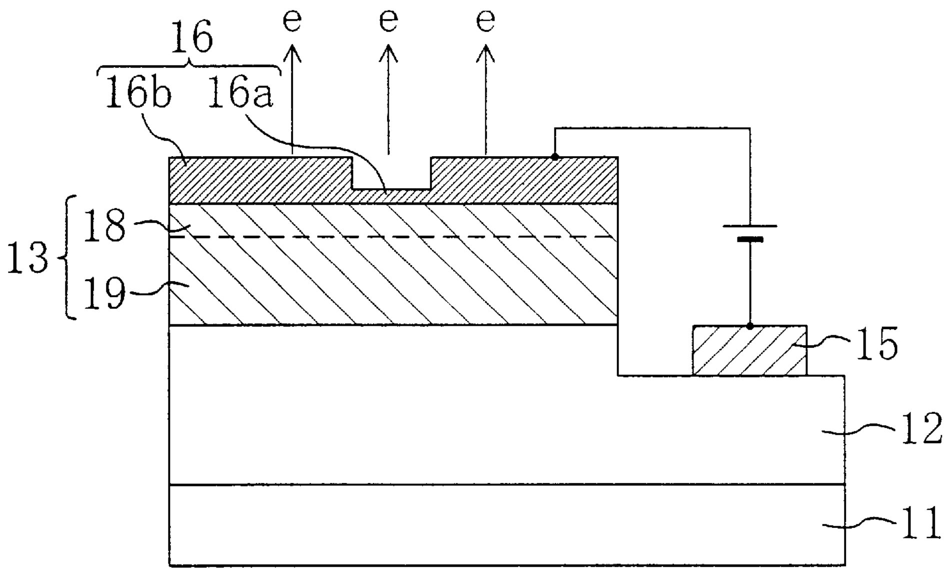
FIG. 11 is a cross-sectional view showing a structure of the NEA electron-emitting device in a third embodiment of the present invention.

FIG. 11 is a cross-sectional view showing a structure of an NEA electron-emitting device in a third embodiment of the present invention. In the present embodiment, as shown in the drawing, an n-GaN layer 12 is disposed as the electron supplying layer on a sapphire substrate 11 and a lower electrode 15 in contact with the n-GaN layer 12 is formed thereon. An $Al_xGa_{1-x}N$ layer 13 is provided on the n-GaN layer 12. In the present embodiment, an AlN layer is not provided. This is because $Al_xGa_{1-x}N$ in the range of $0.65 \leqq x \leqq 1$ can be used for the surface layer since $Al_xGa_{1-x}N$ can form an NEA material if the Al concentration x in $Al_xGa_{1-x}N$ is 0.65 or more, similarly to AlN, though the surface layer is composed of the AlN layer made of the NEA material in the first embodiment. By thus forming the $Al_xGa_{1-x}N$ layer 13 in which the Al concentration x is 0.65 or more in the near-surface portion thereof, the $Al_xGa_{1-x}N$ layer 13 can be divided functionally into an upper portion 18 functioning as the surface layer and a lower portion 19 functioning as the electron transferring layer.

For example, the present embodiment may have a structure obtained by continuously varying the Al concentration x in the $Al_xGa_{1-x}N$ layer 13 from the electron supplying layer side and stopping epitaxial growth at the time when $Al_{0.9}Ga_{0.1}N$ is reached or a structure obtained by continuously varying the Al concentration x in the $Al_xGa_{1-x}N$ layer 13 from the electron supplying layer side and, after the composition of $Al_{0.9}Ga_{0.1}N$ is reached, further epitaxially growing a layer having the same composition and a thickness on the order of several nanometers.

As stated previously, the electron affinity of the surface layer need not necessarily be negative so long as the composition and electron affinity of the surface layer are such that a considerable quantity of electrons distributed in the conduction band have energy levels higher than the vacuum level. Briefly, a material which substantially achieves the NEA state is sufficient to compose the surface layer, even though an intrinsic NEA material is not used.

On the upper portion 19 of the $Al_xGa_{1-x}N$ layer functioning as the surface layer, there is provided a surface electrode 16 made of a metal in Schottky contact therewith. The metal and structured used for the surface electrode 16 are the same as used in the first embodiment.

Although an anode electrode is not provided in the structure shown in FIG. 11, if the anode electrode is provided in opposing relation to the surface electrode 16, a converged electron current can be accelerated/collected by the anode electrode, similarly to the second embodiment.

By applying a forward bias to the NEA electron-emitting device according to the present embodiment (a positive voltage is applied to the surface electrode 16), the electrons supplied from the n-GaN layer 12 (electron supplying layer) can be moved with excellent controllability within the $Al_xGa_{1-x}N$ layer as the electron transferring layer 19 and emitted efficiently from the surface 18 of the $Al_xGa_{1-x}N$ layer functioning as the surface layer, similarly to the first embodiment.

Embodiment 4

Although the third embodiment has used the upper portion of the $Al_xGa_{1-x}N$ layer in the NEA state ($0.65 \leqq x<1$) as the surface layer, it is also possible to deposit an NEA material, such as an AlN layer, directly on the surface layer. In this case, it may be considered that the resulting structure has an energy barrier in the conduction band, as described above with reference to FIG. 6, or the resulting structure has a coating layer composed of AlN. In either case, the electrons can be emitted efficiently into a vacuum, similarly to the foregoing embodiments.

In the structure in which the NEA material is further deposited on the $Al_xGa_{1-x}N$ layer, even when the Al concentration of the $Al_xGa_{1-x}N$ layer is in the range of $0 \leqq x \leqq 0.65$, the electrons injected from the electron supplying layer are allowed to tunnel through the NEA material to the surface if the NEA material such as the AlN layer formed on the surface has a proper thickness (5 to 10 nm), so that the same effects are achievable with the mechanism described above.

Embodiment 5

Figure 12:
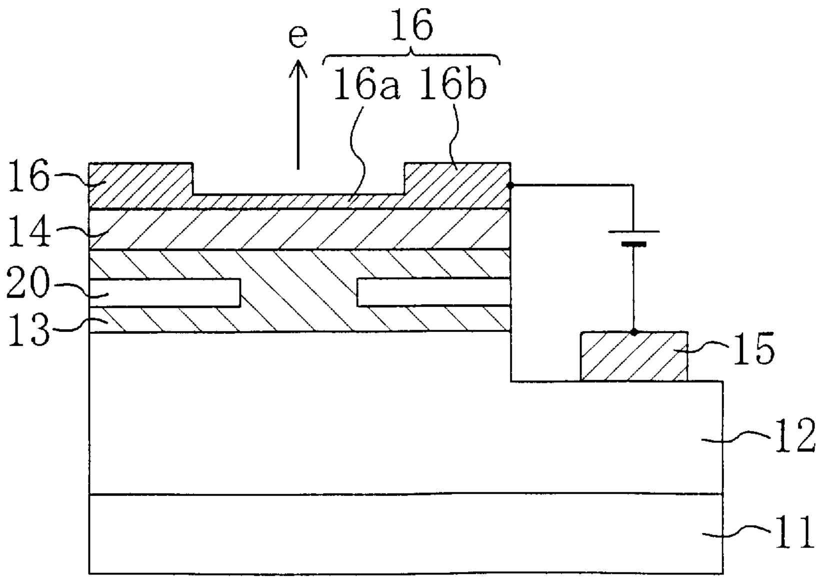
FIG. 12 is a cross-sectional view showing a structure of the NEA electron-emitting device in a fifth embodiment of the present invention.

FIG. 12 is a cross-sectional view showing a structure of an NEA electron-emitting device in a fifth embodiment of the present invention. In addition to the structure according to the first embodiment, the present embodiment has a buried insulating layer (or buried p-type layer) 20 formed in an $Al_xGa_{1-x}N$ layer 13.

In addition to the function as the NEA electron-emitting device according to the first embodiment, the present embodiment has the function of increasing the density of the electrons reaching the surface electrode 16*a* as a primary electron-emitting portion by restricting the current of electrons moving in the $Al_xGa_{1-x}N$ layer as the electron transferring layer with the buried insulating layer 20 provided within the $Al_xGa_{1-x}N$ layer 13. In the case where the buried insulating layer 20 with an aperture diameter of $\phi$ 5 $\mu$m is inserted, the current density obtained is about $2\times10^3$ (A/cm$^2$) due to the converging effect of the electron current.

In the present embodiment also, the thickness of the first region 16*a* of the surface electrode 16 functioning as the electron-emitting portion is preferably minimized in order to enhance the efficiency of electron emission.

Even when the first region 16*a* is not provided, i.e., the center portion of the surface electrode 16 is a hollow space, it is possible to emit the electrons, though with reduced efficiency.

Although the present embodiment has used the AlN layer 14 as the surface layer, $Al_xGa_{1-x}N$ in the range of $0.65 \leqq x \leqq 1$ may be used for the surface layer since $Al_xGa_{1-x}N$ is an NEA material if the Al concentration x in $Al_xGa_{1-x}N$ is 0.65 or more. Even when an AlN layer is further formed on the $Al_xGa_{1-x}N$ surface layer, it may be considered that the resulting structure has an AlN coating layer. In either case, the electrons can be emitted efficiently into a vacuum, similarly to the foregoing embodiments.

Even if the Al concentration in the $Al_xGa_{1-x}N$ layer is in the range of $0 \leqq x \leqq 0.65$ in the present embodiment, the injected electrons are allowed to tunnel through the AlN layer to the surface by adjusting the thickness or the like of the AlN layer used as the surface layer to a proper value, as described above, so that the similar effects are achieved.

Embodiment 6

Figure 13:
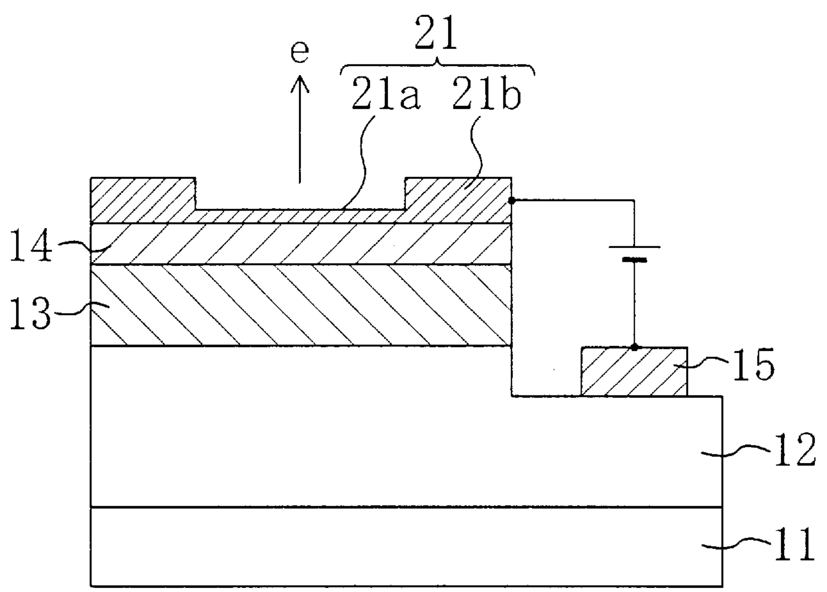
FIG. 13 is a cross-sectional view showing a structure of the NEA electron-emitting device in a sixth embodiment of the present invention.

FIG. 13 is a cross-sectional view showing a structure of an NEA electron-emitting device in a sixth embodiment of the present invention. In the present embodiment, a surface electrode 21 having first and second regions 21*a* and 21*b* composed of metals having different work functions is provided in place of the surface electrodes 16*a* and 16*b* used in the first embodiment. The relationship between the work function $\phi_{M1}$ of the metal composing the first region 21*a* and the work function $\phi_{M2}$ of the metal composing the second region 21*b* is represented by $\phi_{M1}<\phi_{M2}$. As the difference between $\phi_{M1}$ is $\phi_{M2}$ is larger, a greater effect is achieved. The relationship between the thickness $d_{M1}$ of the metal composing the first region 21*a* and the thickness $d_{M2}$ of the metal composing the second region 21*b* is represented by $d_{M1}<d_{M2}$. The metal materials composing the respective regions are not particularly limited provided that the foregoing relationships are established but are selected appropriately in terms of ease of formation or the like. Examples of the metal having a low work function used to compose the first region 21*a* include titanium (Ti), magnesium (Mg), europium (Eu), barium (Ba), and strontium (Sr). Examples of the metal having a high work function used to compose the second region 21*b* include platinum (Pt), chromium (Cr), tungsten (W), nickel (Ni), and gold (Au).

Although a buried insulating layer (buried p-type layer) is not provided in the structure shown in FIG. 13, it may be provided within the $Al_xGa_{1-x}N$ layer 13. Although an anode electrode is not provided in the structure shown in FIG. 13, it may be provided in opposing relation to the surface layer.

Since the first region 21*a* of the surface electrode 21 is composed of a metal having a low work function $\phi$ than that of the metal composing the second region 21*b* in the present embodiment, the following effects are achieved in addition to the effects of the foregoing embodiments.

When a forward bias is applied to the surface electrode 21, a current supplied from the electron supplying layer begins to flow earlier in the region of the AlN layer 14 covered with the first region 21*a* than in the region of the AlN layer 14 covered with the second region 21*b* since an energy barrier between the surface layer 14 and the first region 21*a* is lower than an energy barrier between the surface layer 14 and the second region 21*b*. Consequently, the first region 21*a* functions as an electron-emitting portion and the second region 21*b* functions as a signal connecting portion for contact with the outside.

According to the present embodiment, electrons can be emitted collectively from the first region 21*a* by composing the first region 21*a* of the metal having a work function lower than that of the metal composing the second region 21*b* and a thickness smaller than that of the metal composing the second region 21*b*. Consequently, the efficiency of electron emission can further be increased compared with the foregoing embodiments.

When a bias voltage was applied under the same conditions as used in the foregoing embodiments, for example, the current density obtained was about $1\times10^4$ (A/cm$^2$). In this case, titanium (Ti) having a thickness of 5 nm and a diameter of $\phi$20 $\mu$m was used as the metal composing the first region 21*a* and platinum (Pt) having a thickness of 200 nm and a diameter of $\phi$200 $\mu$m was used as the metal composing the second region 21*b*.

Although the present embodiment has used Ti having a thickness of 5 nm, the thickness of the first region 21*a* of the surface electrode 21 functioning as the electron-emitting portion is preferably minimized in order to enhance the efficiency of electron emission.

Embodiment 7

Figure 14:
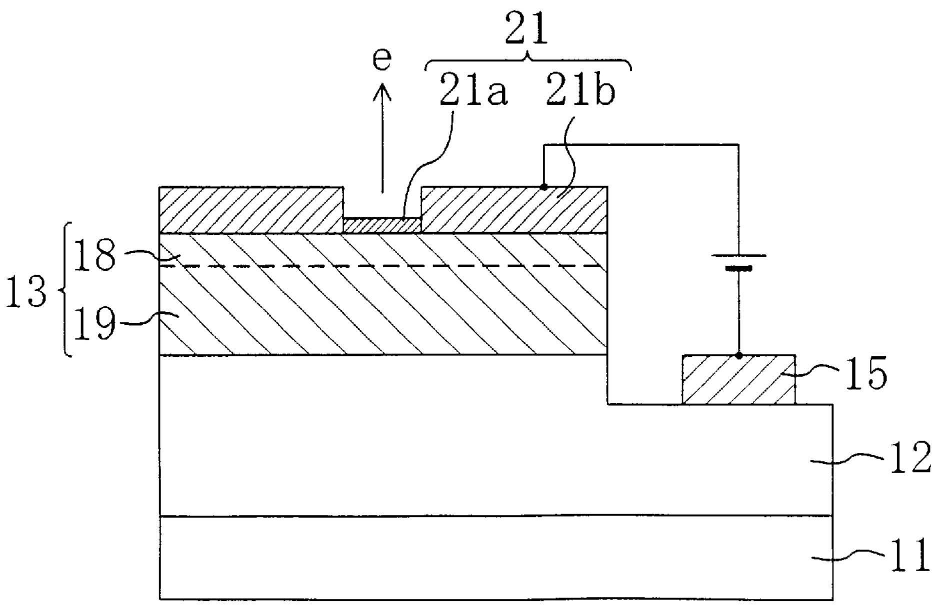
FIG. 14 is a cross-sectional view showing a structure of the NEA electron-emitting device in a seventh embodiment of the present invention.

FIG. 14 is a cross-sectional view showing a structure of an NEA electron-emitting device in a seventh embodiment of the present invention. In the present embodiment, as shown in the drawing, an n-GaN layer 12 is disposed as the electron supplying layer on a sapphire substrate 11 and a lower electrode 15 in contact with the n-GaN layer 12 is formed thereon. In the present embodiment, an AlN layer is not provided. Since an upper portion 18 of an $Al_xGa_{1-x}N$ layer 13 serving as a surface layer and its vicinity is composed to have the Al concentration x=0.65 or more, it has a negative electron affinity and functions as the surface layer. A lower portion 19 of the $Al_xGa_{1-x}N$ layer 13, which is the portion other than the upper portion functioning as the surface layer, functions as the electron transferring layer.

For example, the present embodiment may have a structure obtained by continuously varying the Al concentration x in the $Al_xGa_{1-x}N$ layer from the electron supplying layer side and stopping epitaxial growth at the time when $Al_{0.9}Ga_{0.1}N$ is reached or a structure obtained by continuously varying the Al concentration x in the $Al_xGa_{1-x}N$ layer from the electron supplying layer side and, after the composition of $Al_{0.9}Ga_{0.1}N$ is reached, further epitaxially growing a layer having the same composition and a thickness on the order of several nanometers. As stated previously, the electron affinity of the surface layer need not necessarily be negative. Briefly, a material which substantially achieves the NEA state is sufficient to compose the surface layer, even though an intrinsic NEA material is not used.

The present embodiment is provided with a surface electrode 21 having first and second regions 21*a* and 21*b* composed of metals having different work functions, similarly to the sixth embodiment. The metals to be used and the conditions thereof are selected appropriately from those described in the sixth embodiment.

In the present embodiment also, electrons can be emitted collectively from the first region 21*a* by composing the first region 21*a* of the metal having a work function smaller than that of the metal composing the second region 21*b* and a thickness smaller than that of the metal composing the second region 21*b*. Consequently, the efficiency of electron emission can further be increased compared with the foregoing embodiments.

Although an anode electrode is not provided in the structure shown in FIG. 14, the anode electrode may be provided in opposing relation to the surface layer.

Although the present embodiment has used $Al_xGa_{1-x}N$ in the range of $0.65 \leqq x \leqq 1$ for the surface layer, if the AlN layer is further formed thereon, it may also be considered that the resulting structure has an AlN coating layer. Accordingly, the electrons can be extracted efficiently into a vacuum, similarly to the foregoing embodiments.

Even if the Al concentration in the $Al_xGa_{1-x}N$ layer is $0 \leqq x \leqq 0.65$ in the present embodiment, the injected electrons are allowed to tunnel through the AlN layer to the surface by adjusting the thickness or the like of the AlN layer used as the surface layer to a proper value, as described above, so that the similar effects are achieved.

Embodiment 8

Figure 15:
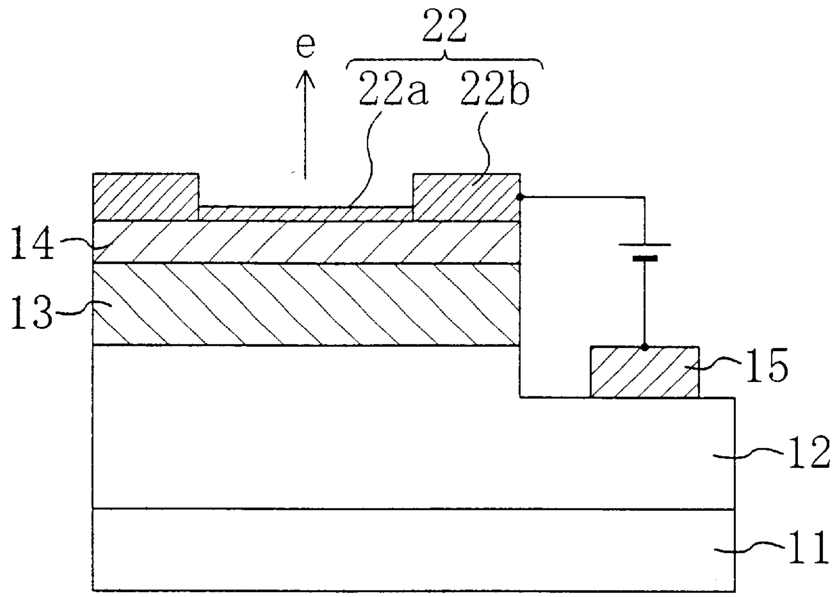
FIG. 15 is a cross-sectional view showing a structure of the NEA electron-emitting device in an eighth embodiment of the present invention.

FIG. 15 is a cross-sectional view showing a structure of an NEA electron-emitting device in an eighth embodiment of the present invention. As shown in the drawing, the structure of the NEA electron-emitting device of the present embodiment is seemingly the same as that of the sixth embodiment shown in FIG. 13. The structures of the sapphire substrate 11, n-GaN layer 12, $Al_xGa_{1-x}N$ layer 13, AlN layer 14, and lower electrode 15 are also the same as in the sixth embodiment.

In the present embodiment, a surface electrode 22 having first and second regions 22*a* and 22*b* composed of metals having different resistance to ion bombardment is provided in place of the surface electrodes 21*a* and 21*b* used in the sixth embodiment. The metal materials composing the respective regions are selected appropriately. Examples of the metal composing the first region 22*a* include titanium (Ti), magnesium (Mg), europium (Eu), barium (Ba), and strontium (Sr), each of which has a low work function as described above. Examples of the metal composing the second region 22*b* include tungsten (W), molybdenum (Mo), and tantalum (Ta), each of which has high resistance to ion bombardment.

Although an anode electrode is not provided in the structure shown in FIG. 15, the anode electrode may be provided in opposing relation to the surface layer.

Since the second region 22*b* of the surface electrode 22 is composed of the metal having high resistance to ion bombardment, the following effects are achieved in addition to the effects of the foregoing embodiments.

When a forward bias is applied to the surface electrode 22, electrons are emitted primarily from the region of the AlN layer 14 covered with the first region 22*a*. When the electrons are emitted from the surface layer of the electron-emitting device into a vacuum, they collide with gas molecules in the remaining gas to produce ions before reaching the anode electrode (not shown). Since the ions are accelerated toward the surface electrode 22 to collide at a high speed with the surface electrode, so-called ion bombardment occurs. In that case, the electron- emitting portion within the surface electrode is worn out by the ion bombardment and the lifespan of the NEA electron-emitting device may be shortened. However, if the second region 22*b* of the surface electrode is formed of the metal with high ion resistance, the region upon which the ions impinge can be divided and the wearing of the surface electrode can be lessened.

According to the present embodiment, the durability of the NEA electron-emitting device can be increased compared with the foregoing embodiments by using the metal with high resistance to ion bombardment for the second region 22*b*.

Embodiment 9

Figure 16:
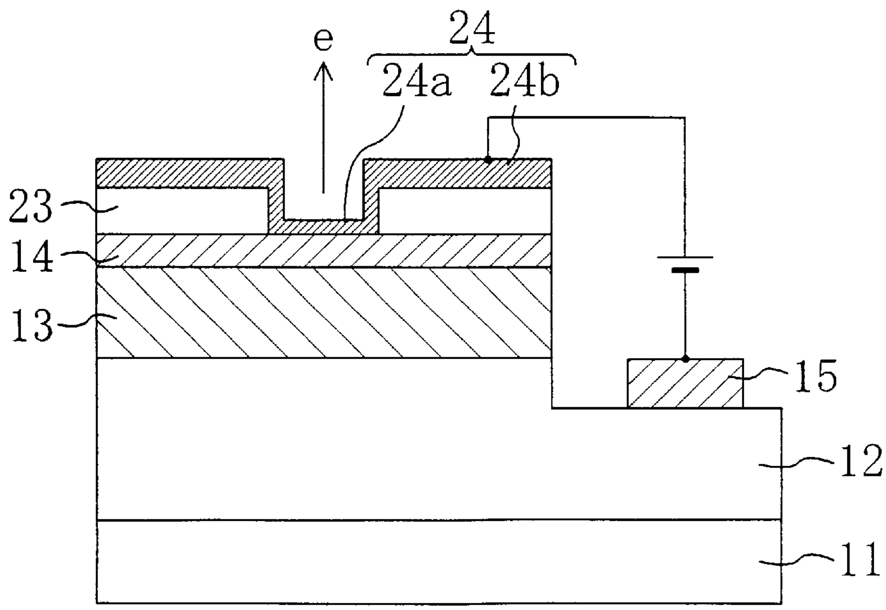
FIG. 16 is a cross-sectional view showing a structure of the NEA electron-emitting device in a ninth embodiment of the present invention.

FIG. 16 is a cross-sectional view showing a structure of an NEA electron-emitting device in a ninth embodiment of the present invention. In the present embodiment, an insulator film 23 composed of an oxide film or a nitride film partially opened is provided in addition to the structure of each of the foregoing embodiments. A first region 24*a* of a surface electrode 24 is provided over the region corresponding to the bottom of the opening in the insulator film 23, while a second region 24*b* of the surface electrode 24 is provided extensively over the side surfaces of the insulator film 23 and the top surface thereof. The first region 24*a* functions as the electron-emitting portion, while the second region 24*b* mainly functions as the signal connecting portion for contact with the outside.

In the present embodiment, each of the first and second regions 24*a* and 24*b* of the surface electrode is composed of a metal in Schottky contact with the surface layer such as titanium (Ti), magnesium (Mg), europium (Eu), barium (Ba), or strontium (Sr), each of which has a small work function. The first region 24*a* has a particularly small thickness of 10 nm or less, while the second region 24*b* has a relatively large thickness of 100 nm or more. It is to be noted that the second region 24*b* may be composed of a metal other than the metal composing the first region 24*a,* such as platinum (Pt), chromium (Cr), tungsten (W), nickel (Ni), or gold (Au), each of which has a high work function.

Since the surface electrode 24 is composed of the region into which the insulator films 23 have been inserted and the region into which the insulator film 23 has not been inserted in the present embodiment, the following effects can be achieved in addition to the effects of the foregoing embodiments.

When a forward bias is applied to the surface electrode 24, the electron current supplied from the electron supplying layer and moving in the electron transferring layer converges only on the first region 24*a* since the AlN layer 14 is in contact with the first region 24*a* of the surface electrode functioning as the electron-emitting portion at the bottom of the opening in the insulator film, while it is in contact with the insulator film in the other regions. Thus, according to the present embodiment, the electrons can be emitted collectively from the first region 24*a* by forming the thin surface electrode layer (first region 24*a*) at the bottom of the opening. Consequently the efficiency of electron emission can further be increased compared with the foregoing embodiments.

Although an anode electrode is not provided in the structure shown in FIG. 16, the anode electrode may be provided in opposing relation to the surface layer.

Although the present embodiment has used the AlN layer 14 as the surface layer, $Al_xGa_{1-x}N$ in the range of $0.65 \leqq x \leqq 1$ may be used for the surface layer since $Al_xGa_{1-x}N$ is an NEA material if the Al concentration x in $Al_xGa_{1-x}N$ is 0.65 or more. Even when the AlN layer is further formed on the $Al_xGa_{1-x}N$ surface layer, it may be considered that the resulting structure has an Al coating layer. In either case, the electrons can be extracted efficiently into a vacuum, similarly to the foregoing embodiments.

Even if the Al concentration in the $Al_xGa_{1-x}N$ layer is $0 \leqq x \leqq 0.65$ in the present embodiment, the injected electrons are allowed to tunnel through the AlN layer to the surface by adjusting the thickness or the like of the AlN layer used as the surface layer to a proper value, as described above, so that the similar effects are achieved.

Embodiment 10

Figure 17:
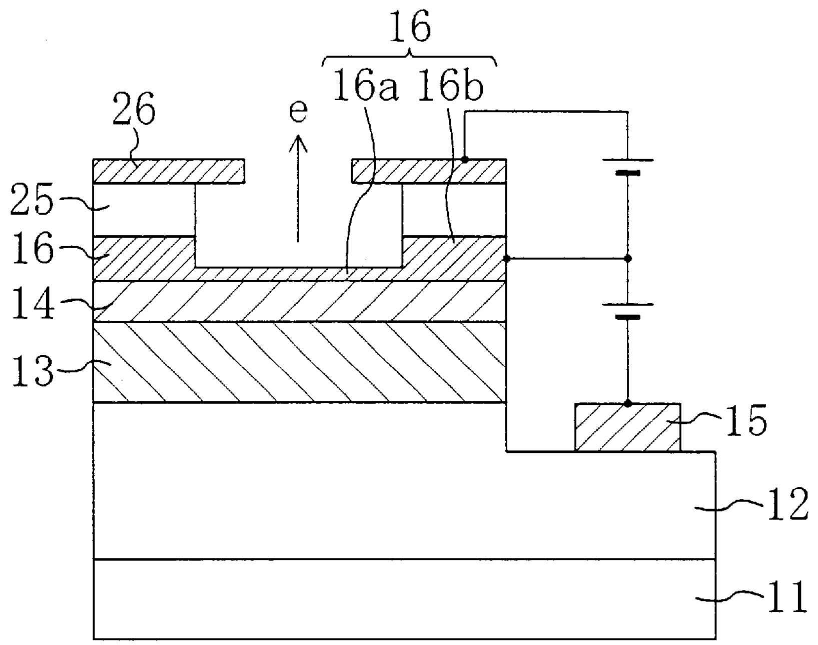
FIG. 17 is a cross-sectional view showing a structure of the NEA electron-emitting device in a tenth embodiment of the present invention.

FIG. 17 is a cross-sectional view showing a structure of an NEA electron-emitting device in a tenth embodiment of the present invention. In addition to the structure of the first embodiment, the present embodiment has an insulator film 25 such as an oxide film or a nitride film formed over a second region 16*b* of a surface electrode 16 and a control electrode 26 disposed on the insulator film 25.

The NEA electron-emitting device of the present embodiment has the function of controlling the electron current emitted into a vacuum in addition to the function as the NEA electron-emitting device of the first embodiment.

If a forward bias is applied between the lower electrode 15 and the surface electrode 16 and a proper positive voltage is further applied to the control electrode 26, for example, it becomes possible to prevent the electron current emitted into a vacuum from being scattered by the effect of the bias applied to the control electrode 18. The conditions for the fabrication of the device used in this case are the same as used in the first embodiment for the electron supplying layer 12, the electron transferring layer 13, the surface layer 14, and the surface electrode 16. The diameter of the electron-emitting region (opening of the control electrode 26) is $\phi 10$ $\mu$m and the thickness of the oxide film 25 is 10 $\mu$m.

In the present embodiment also, the thickness of the first region 16*a* of the surface electrode 16 functioning as the electron-emitting portion is preferably minimized in order to enhance the efficiency of electron emission.

Even when the first region 16*a* is not provided, i.e., the center portion of the surface electrode 16 is a hollow space, it is possible to emit the electrons, though with reduced efficiency.

Although the present embodiment has used the AlN layer 14 as the surface layer, $Al_xGa_{1-x}N$ in the range of $0.65 \leqq x \leqq 1$ may be used for the surface layer since $Al_xGa_{1-x}N$ is an NEA material if the Al concentration x in $Al_xGa_{1-x}N$ is 0.65 or more. Even when the AlN layer is further formed on the $Al_xGa_{1-x}N$ surface layer, it may be considered that the resulting structure has an AlN coating layer. In either case, the electrons can be emitted efficiently into a vacuum, similarly to the foregoing embodiments.

Even if the Al concentration in the $Al_xGa_{1-x}N$ layer is in the range of $0 \leqq x \leqq 0.65$ in the present embodiment, the injected electrons are allowed to tunnel through the AlN layer to the surface by adjusting the thickness or the like of the AlN layer used as the surface layer to a proper value, as described above, so that the similar effects are achieved.

Although an anode electrode is not provided in the structure shown in FIG. 17, if the anode electrode is provided in opposing relation to the control electrode, a converged electron current can be accelerated/collected by the anode electrode.

Embodiment 11

Figure 18:
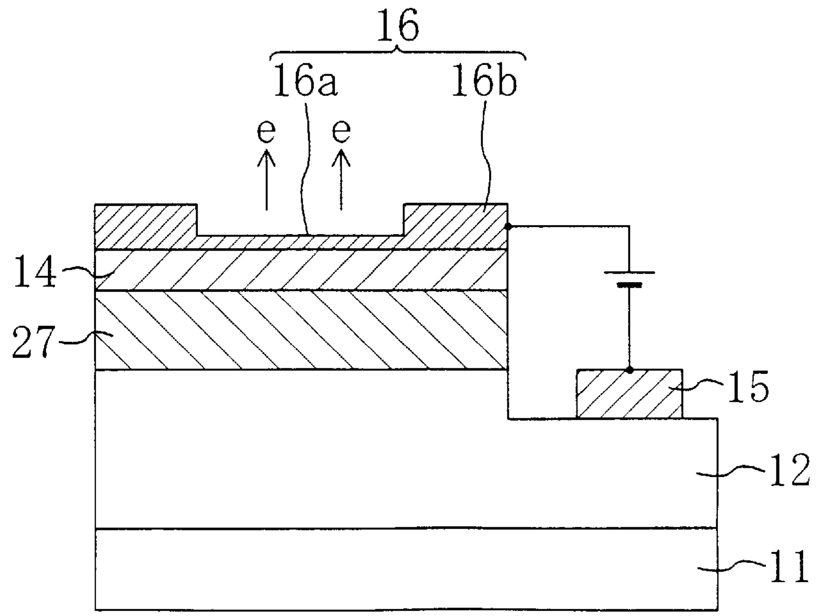
FIG. 18 is a cross-sectional view showing a structure of a microvacuum transistor in an eleventh embodiment of the present invention.

FIG. 18 is a cross-sectional view showing a structure of an NEA electron-emitting device in an eleventh embodiment of the present invention. As shown in the drawing, the structure of the NEA electron-emitting device of the present embodiment is seemingly the same as the structure of the sixth embodiment shown in FIG. 9. In the present embodiment, however, a superlattice layer 27 composed of two AlN layers (thickness: 5 nm) and two GaN layers (thickness: 5 nm) which are alternately stacked is used as the electron transferring layer. In short, the structure of the present embodiment is obtained by depositing the superlattice layer 27 composed of the AlN/GaN/AlN/GaN layers on an n-GaN layer 12 and further forming an AlN layer 14 (surface layer) thereon. As for a surface electrode 16, it is the same as in the first embodiment.

Although an anode electrode is not provided in the structure shown in FIG. 18, the anode electrode may be disposed in opposing relation to the surface layer.

A forward bias of about 2 to 10 V was applied between the lower electrode and the surface electrode in the NEA electron-emitting device with the structure of the eleventh embodiment, with the result that a current of emitted electrons of about $10^2$ to $10^3$ (A/cm$^2$) was observed depending on the applied voltage, similarly to the foregoing embodiments.

Embodiment 12

Figure 19A:
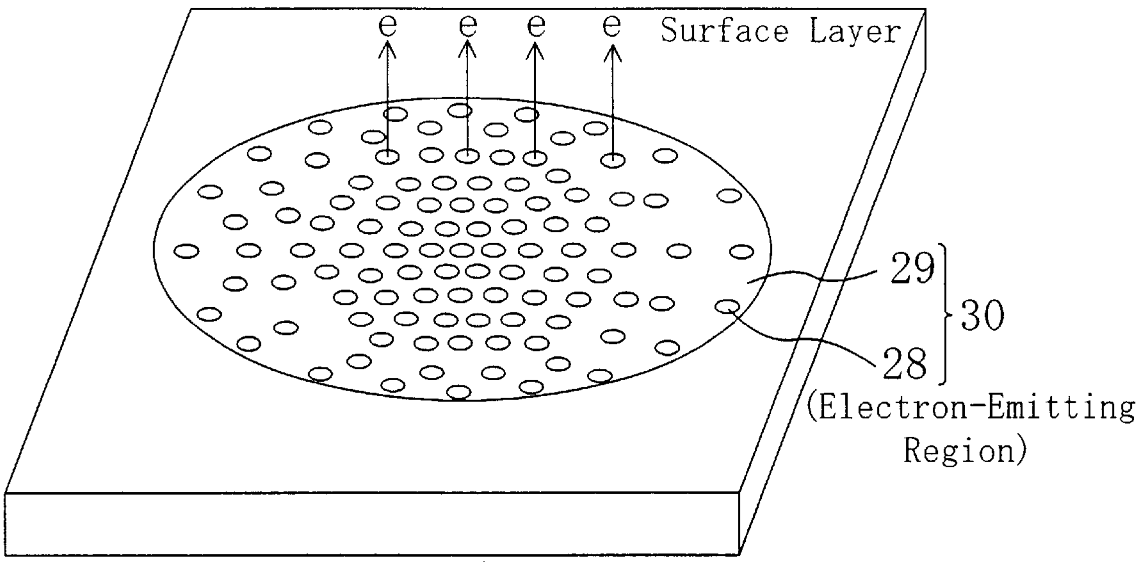
FIGS. 19(*a*) and 19(*b*) illustrate a structure of the surface electrode portion of the NEA electron-emitting device applicable to each of the embodiments.
Figure 19B:
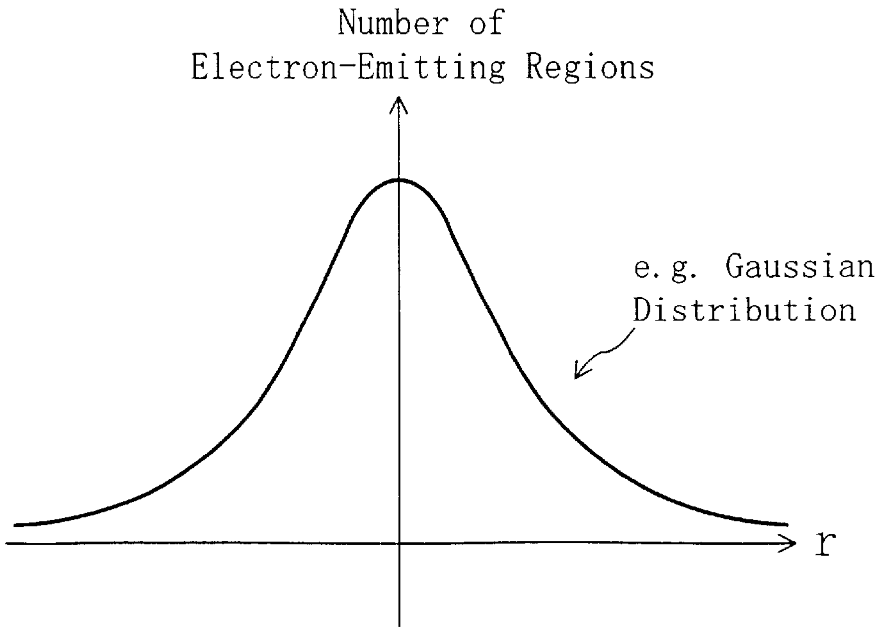

FIG. 19 illustrate a structure of a surface electrode portion of an NEA electron-emitting device applicable to each of the foregoing embodiments. In each of the first to eleventh embodiments described above, the proportions of the first and second regions of the surface electrode are generally arbitrary. By properly determining the proportions, the configuration and intensity distribution of an emitted electron beam can be controlled.

FIG. 19(*a*) is a perspective view of the surface electrode portion of an NEA electron-emitting device having a surface electrode in a prescribed arrangement. The whole surface electrode 30 is composed of first and second regions 28 and

29. In the present embodiment, the first region 28 primarily functioning as the electron-emitting region is distributed in dots of extremely small size which are enclosed with the second region 29. The density of the dots is normally expressed as a Gaussian distribution as shown in FIG. 18(*b*). The configuration of the first region 28 shown in FIG. 19(*a*) can be used as that of the first region 16*a* in the first to fifth, tenth, and eleventh embodiments (see FIGS. 9 to 12, FIG. 17, and FIG. 18), as that of the first region 21*a* in the sixth and seventh embodiments (see FIGS. 13 and 14), as that of the first region 22*a* in the eighth embodiment (see FIG. 15), and as that of the first region 24*a* in the ninth embodiment (see FIG. 16).

As shown in FIG. 19(*a*), a large number of extremely small first regions 28 exist within the surface electrode 30. As described above, the thickness of the metal electrode disposed in the first region 28 is in the range of about 5 to 10 nm, while the thickness of the metal electrode disposed in the second region 29 is 100 nm or more. In a specific example of the structure, the size of the entire surface region 30 is about ϕ300 μm and about 1500 first regions 28 each having a diameter of ϕ5 μm are arranged in a distribution in which the center portion of the surface electrode is dense (Gaussian distribution). By thus forming the surface electrode, it was proved that the widening of the emitted electron current was suppressed compared with the case where electrons are emitted uniformly from the whole surface electrode.

Thus, according to the present embodiment, a large number of distinct electron-emitting regions (first regions 28) which are extremely small in size can be arranged within the surface electrode 30 and the intensity distribution of the emitted electron current can be controlled by appropriately setting the distribution. In that case, the configuration of the electron beam can be controlled as desired and the intensity distribution in the electron beam can be controlled to a desired one, e.g., to a Gaussian distribution by appropriately adjusting the size, configuration, and number of the electron-emitting regions. The electron beam obtained is less widened than an electron beam obtained from a conventional single electron-emitting source capable of providing the same peak intensity.

It is to be noted that the electron-emitting portion may be a through hole and the metal film may not exist.

Embodiment 13

By way of example, the present embodiment will describe the case where the foregoing NEA electron-emitting device is applied to a vacuum transistor.

Figure 20:
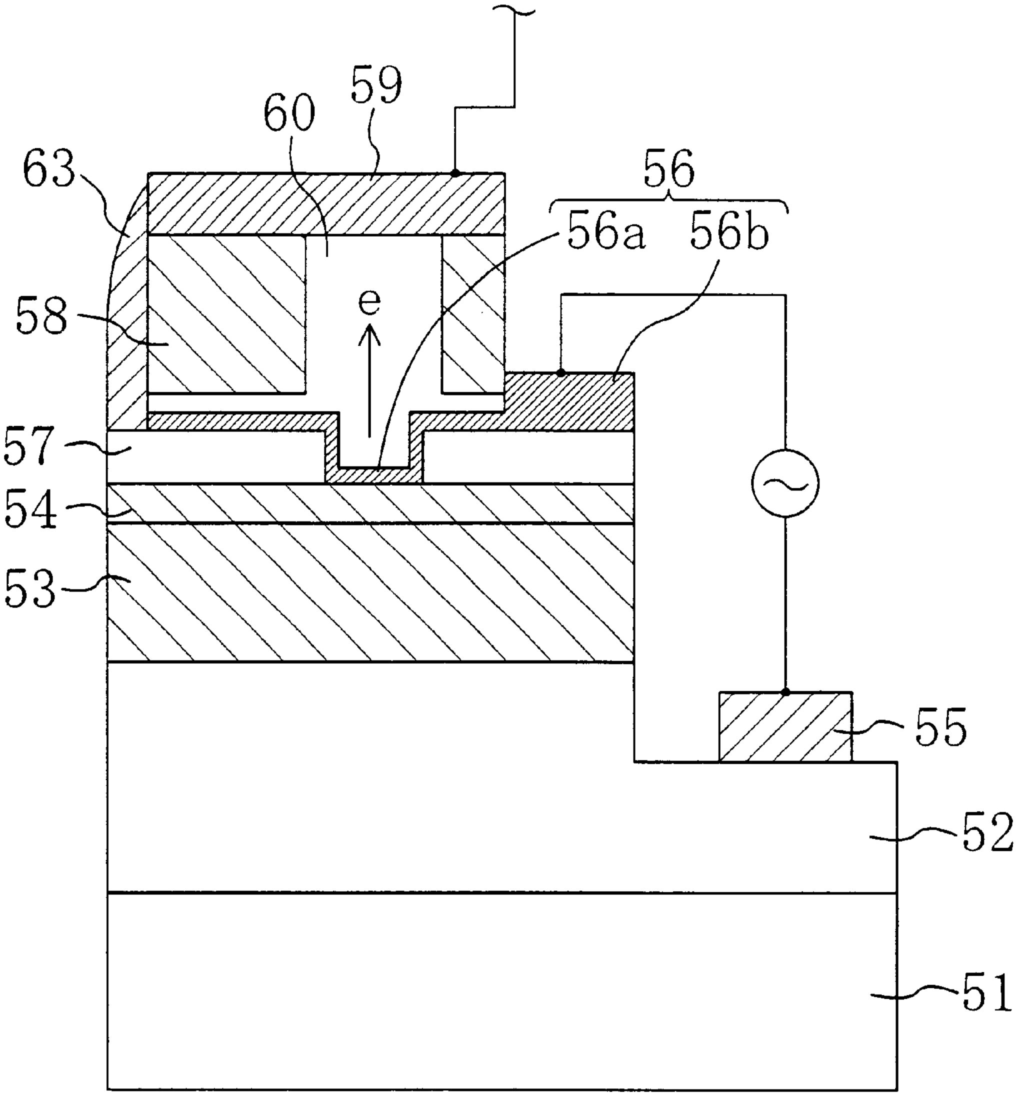
FIG. 20 is a cross-sectional view showing a structure of the microvacuum transistor in a thirteenth embodiment of the present invention.
Figure 21A:
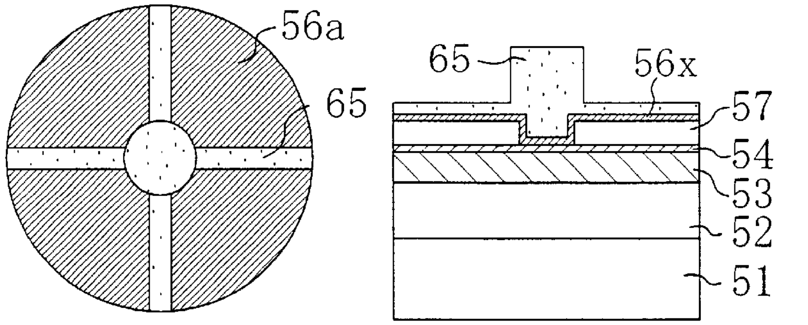
FIGS. 21(*a*) to 21(*d*) are cross-sectional views illustrating the process of manufacturing the microvacuum transistor in the thirteenth embodiment.
Figure 21B:
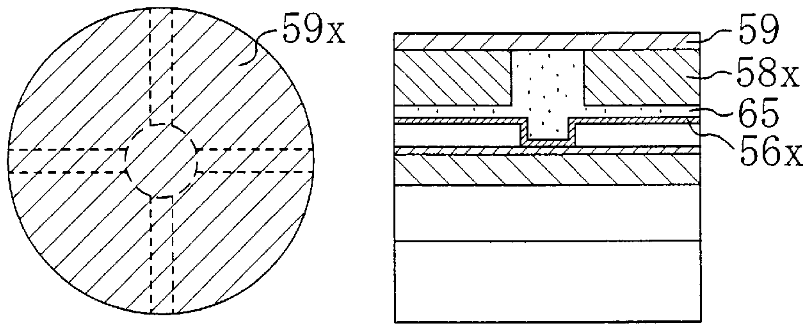
Figure 21C:
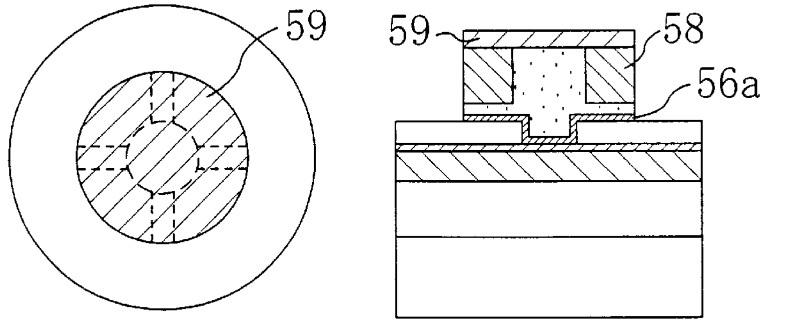
Figure 21D:
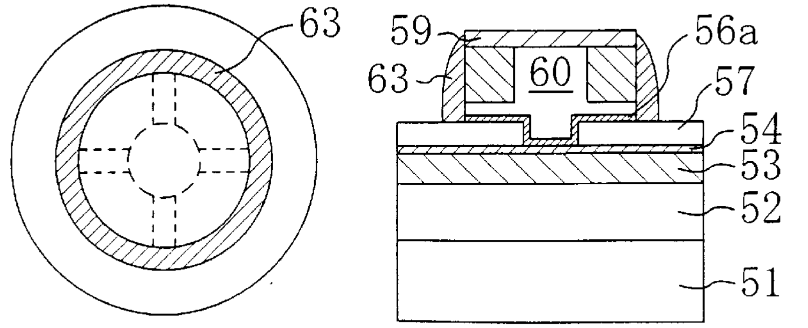

FIG. 20 is a cross-sectional view showing a structure of a microvacuum transistor in a thirteenth embodiment of the present invention. The microvacuum transistor according to the present embodiment uses the structure of an NEA electron-emitting device similar to that of the NEA electron-emitting device of the ninth embodiment shown in FIG. 16. As shown in FIG. 20, the microvacuum transistor of the present embodiment comprises: a sapphire substrate 51; an n-GaN layer 52 provided on the sapphire substrate 51 to function as an electron supplying layer; an $Al_xGa_{1-x}N$ layer 53 which is a graded composition layer having a composition varying nearly continuously and provided on the n-GaN layer 52 to function as the electron transferring layer; an AlN layer 54 provided on the $Al_xGa_{1-x}N$ layer 53 to function as a surface layer; a lower electrode 55 provided on the n-GaN layer 52; a surface electrode 56 provided on the AlN layer 54 to be in Schottky contact therewith; and a first insulating film 57 formed on the AlN layer 54 and having an opening. The first insulating film 57 is typically composed of silicon oxide or the like. A thin portion 56*a* of the surface electrode 56 is formed extensively over the surface of the AlN layer 54 exposed at the bottom surface of the opening in the first insulating film 57, the side surfaces of the opening in the first insulating film 57, and the top surface of the first insulating film 57. The thin portion 56*a* of the surface electrode 56 is composed of a metal having a thickness of about 5 to 10 nm. The portion of the thin portion 56*a* in Schottky contact with the AlN layer 54 serves as an electron-emitting portion. A thick portion 56*b* of the surface electrode 56 is composed of a metal having a thickness of 100 nm or more provided on the first insulating film 57. The thick portion 56*b* is connected to the thin portion 56 to function as a pad portion for interconnection. The foregoing structure is basically common to the NEA electron-emitting devices described in the foregoing embodiments.

In the present embodiment, a second insulating film 58 configured as a partially cut cylinder having an inner diameter larger than the diameter of the opening of the first insulating film 57 and an upper electrode 59 composed of a metal closing the upper end of the second insulating film 58 are provided on the first insulating film 57. The second insulating film 58 is also typically composed of silicon oxide or the like. A sidewall 63 composed of silicon oxide or silicon nitride enclosing the second insulating film 58 is formed on the first insulating film 57. An electron flow room 60 defined by the surface electrode 56, the second insulating film 58, the sidewall 63, and the upper electrode 59 has an inner diameter of about 10 μm and is under a reduced pressure of about 10–5 Torr (about 1.3 mPa).

In the present embodiment, the $Al_xGa_{1-x}N$ layer 53 has a graded composition such that the Al concentration relative to the Ga concentration is approximately 0 (x=0) at the bottom, while it is approximately 1 at the top.

In the foregoing structure, a solid layer functioning as an electron control layer is composed of the semiconductor layer 52 and the electron transferring layer 53 and the upper electrode 59 functions as an external electrode, while a closing member is composed of the second insulating film 58 and the sidewall 63.

In the present vacuum transistor, the electrons emitted in response to a signal applied between the surface electrode 56 and the lower electrode 55 are accelerated in the electron flow room 60 under reduced pressure and received by the upper electrode 59. Since the electron flow region is in a vacuum, the present vacuum transistor functions as an amplifying or switching element which is excellent in insulating property, reduced in internal loss, and less temperature-dependent.

Although the microvacuum transistor of the present embodiment uses the structure of the NEA electron-emitting device similar to that of the NEA electron-emitting device of the ninth embodiment, it is not limited thereto. The vacuum transistor of the present embodiment can also use the structure of the NEA electron-emitting device described in any of the first to eleventh embodiments.

A description will be given to a method of manufacturing the vacuum transistor of the present embodiment. FIGS. 21(*a*) to 21(*d*) illustrate the process of manufacturing the vacuum transistor in the present embodiment.

First, the n-GaN layer 52 as the electron supplying layer, the $Al_xGa_{1-x}N$ layer 53 as the electron transferring layer, and the AlN layer 54 as the surface layer are formed on the sapphire substrate 51. The process steps are the same as described in the first embodiment.

Next, in the step illustrated in FIG. 21(*a*), a silicon oxide film is deposited as the first insulating film 57 and the opening for the electron-emitting portion is formed therein. Thereafter, a titanium film 56*x* with a thickness of 5 to 10 nm is deposited over the entire surface of the substrate to form the thin portion 56*a* of the upper electrode 56. An aluminum film is further deposited thereon and then patterned to form a core 65 consisting of the cylindrical portion located at a nearly concentric position with the opening in the first insulating film 57 and having a diameter larger than that of the opening in the first insulating film 57 and beam portions extending in four directions from the bottom of the cylindrical portion. The core 65 is formed easily by forming a water wheel pattern composed of a cylindrical portion having a vertical axis and vertical wall portions extending radially in four directions from the cylindrical portion and having the same thickness through the first patterning of the aluminum film and then reducing the thickness of the vertical walls portions by the first patterning. It is to be noted that the core 65 may also be composed of a photoresist. The thickness of the vertical wall portions may be reduced slightly or may not be reduced at all depending on the material of the sidewalls 63 to be formed later.

Next, in the step shown in FIG. 21(*b*), a silicon oxide film 58*x,* which is to form the second insulating film 59, is deposited by low-temperature CVD and then planarized by, e.g., CMP till the core 65 composed of the aluminum film is exposed. Thereafter, a tungsten film 59*x,* which is to form the upper electrode 59, is deposited over the entire surface of the substrate.

Next, in the step shown in FIG. 21(*c*), the whole structure consisting of the tungsten film 59*x,* the silicon oxide film 58*x,* the core 65, and the titanium film 56*x* is patterned into an upright cylindrical configuration, whereby the sizes of the first insulating film 58, the upper electrode 59, and the thin portion 56*a* of the surface electrode 56*a* are roughly determined.

Next, in the step shown in FIG. 21(*d*), the entire substrate is immersed in a sulfuric peroxide solution (solution mixture of sulfuric acid and aqueous hydrogen peroxide). Since the end faces of the beam portions of the core 65 are exposed in the step, the core 65 composed of aluminum is etched by the sulfuric peroxide solution from the beam portions and finally removed. As a result, the electron flow room 60 enclosed by the second insulating film 58, the upper electrode 59, and the thin portion 56*a* of the surface electrode 56 is formed.

Next, a thick silicon oxide film is deposited on the substrate to close caves formed after the beam portions of the core 65 were removed. At first, the major part of the caves is closed by low-voltage CVD or the like and the caves are finally closed completely by MBE, sputtering, or like process, whereby the degree of vacuum (degree of pressure reduction) of the internal electron flow room 60 is adjusted to the order of, e.g., $10^{-5}$ Torr (about 1.3 mPa). Thereafter, the thick silicon oxide film is etched anisotropically to form the sidewalls 63 enclosing the side surfaces of the upper electrode 59, the second insulating film 58, and the thin portion 56*a* of the surface electrode 56.

After one end portions of the sidewalls 63, upper electrode 59, and second insulating film 58 are removed, a metal film (e.g., a Pt film) is deposited on the substrate and patterned, thereby forming the thick portion 56*b* of the surface electrode 56. Thereafter, a hole reaching a part of the n-GaN layer 52 is formed in the substrate such that the lower electrode 55 is formed.

The foregoing process allows easy formation of the vacuum transistor.

It will be appreciated that the vacuum transistor can be formed by using not only the structure of the present embodiment but also the structure of the NEA electron-emitting device disclosed in any of the first to eleventh embodiments. It is therefore possible to provide a superlattice layer instead of the $Al_xGa_{1-x}N$ layer 53 or provide a surface electrode in direct Schottky contact with the $Al_xGa_{1-x}$ N layer in the absence of the AlN layer 54.

Embodiment 14

A description will be given to a vacuum transistor according to a fourteenth embodiment of the present invention, which may be considered as a variation of the thirteenth embodiment.

Figure 22:
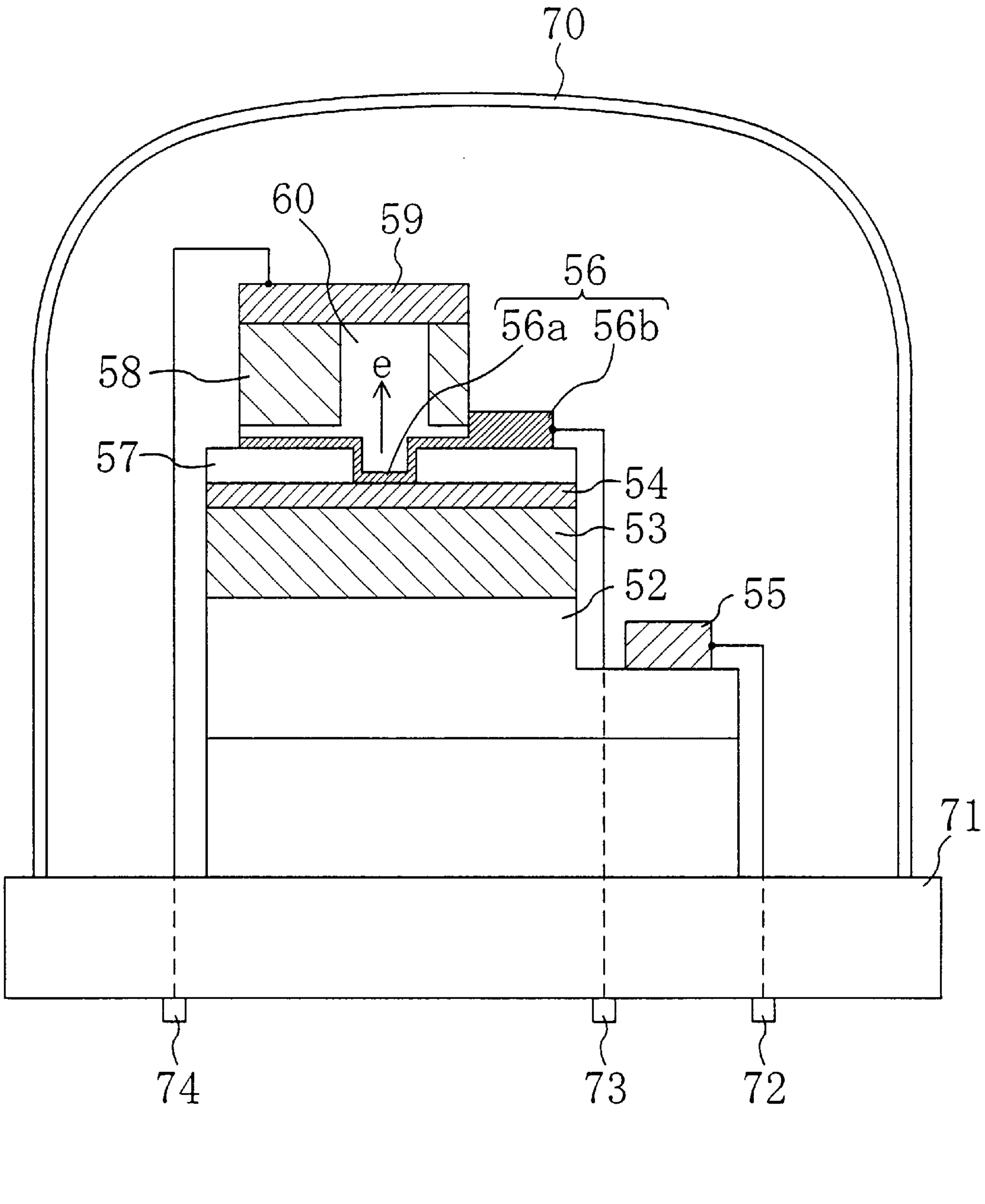
FIG. 22 is a cross-sectional view showing a structure of the microvacuum transistor in a fourteenth embodiment of the present invention.

FIG. 22 is a cross-sectional view showing a structure of the vacuum transistor in the present embodiment. The present embodiment has a structure in which an NEA electron-emitting device is contained in an airtight container.

As shown in FIG. 22, the vacuum transistor of the present embodiment has: a sealing cap 70; a jig 71 for mounting the cap 70 and the NEA electron-emitting device; a lower electrode 55; a surface electrode 56; and terminals 72 to 74 to be electrically connected to the upper electrode 59 in addition to substantially the same structure as shown in FIG. 20 illustrating the thirteenth embodiment. In the present embodiment, however, an electron flow room 60 is not sealed by the second insulating film 58, the upper electrode 59, and the like and the second insulating film 58 is configured as a bridge. In addition, the sidewall 63 shown in FIG. 20 does not exist. In the present embodiment, the sealing member is composed of the cap 70 and the jig 71 and the internal electron flow room 60 is kept in a high vacuum of $10^{-5}$ Torr (about 1.33 mPa) or less.

The present embodiment can also achieve the same effects as achieved by the thirteenth embodiment. In particular, the present embodiment is advantageous in that the degree of vacuum (degree of pressure reduction) of the electron flow room 60 can be adjusted to $10^{-5}$ Torr (about 1.33 mPa) or less.

Other Embodiments

Although the first to eleventh embodiments have shown the variety of exemplary structures, it is also possible to use the structures in combination to achieve the combined effects.

Although the surface layer has been composed of AlN or $Al_xGa_{1-x}N$ in the foregoing embodiments, the surface layer may also be composed of another NEA material such as diamond.

It is also possible to stack films of AlN, $Al_xGa_{1-x}N$, or two or more of such NEA materials in layers. For example, an extremely thin coating layer such as diamond layer may be provided on the surface layer in each of the embodiments to protect the surface layer. In the case where a metal film is not provided on the electron-emitting portion such that the space over the surface layer is kept open, in particular, the coating layer is preferably provided to protect the AlN or $Al_xGa_{1-x}N$ layer composing the surface layer.

It is also possible to dope the $Al_xGa_{1-x}N$ layer with an n-type dopant and allow the $Al_xGa_{1-x}N$ layer to function as an an-type semiconductor in each of the first to eleventh embodiments.

A plurality of electron-emitting portions may be provided in a single device in each of the first to eleventh embodiments.

Although the Al concentration x in the $Al_xGa_{1-x}N$ layer has varied continuously in each of the embodiments using the $Al_xGa_{1-x}N$ layer, the Al concentration in the $Al_xGa_{1-x}N$ layer may vary, e.g., stepwise.

What is claimed is:

1. An electron-emitting device comprising:

a semiconductor layer functioning as an electron supplying layer;

a surface layer disposed in spaced relation to the semiconductor layer, the surface layer being composed of a material having a negative electron affinity or a positive electron affinity close to zero;

a graded composition layer interposed between the semiconductor layer and the surface layer, the graded composition layer having a varying composition such that the electron affinity decreases in a direction from the semiconductor layer toward the surface layer; and a surface electrode disposed on the surface layer, the surface electrode applying a voltage such that electrons are supplied from the semiconductor layer to an outermost surface of the surface layer, wherein the surface layer and the graded composition layer are undoped semiconductor layers.

2. The electron-emitting device of claim 1, wherein at least a part of the graded composition layer has a band gap enlarged nearly continuously from the semiconductor layer to the surface layer.

3. The electron-emitting device of claim 1, wherein the surface layer contains aluminum nitride (AlN).

4. The electron-emitting devise of claim 1, wherein a region including the graded composition layer and the surface layer is composed of $Al_xGa_{1-x}N$ ($0 \leqq x \leqq 1$) in which the proportion of Al increases with approach toward the outermost surface.

5. The electron-emitting device of claim 1, wherein the surface electrode is in Schottky contact with the surface layer.

6. An electron-emitting device comprising:

a semiconductor layer functioning as an electron supplying layer;

a surface layer disposed in spaced relation to the semiconductor layer, the surface layer being composed of a material having a negative electron affinity or a positive electron affinity close to zero;

an electron transferring layer interposed between the semiconductor layer and the surface layer, the electron transferring layer supplying electrons in a direction from the semiconductor layer toward the surface layer; and a surface electrode disposed in Schottky contact with at least a part of the surface layer, the surface electrode applying a voltage such that the electrons are supplied from the semiconductor layer to an outermost surface of the surface layer, wherein the electron transferring layer and the surface layer are undoped semiconductor layers.

7. The electron-emitting device of claim 6, wherein the electron transferring layer has a varying composition such that the electron affinity decreases in the direction from the semiconductor layer toward the surface layer.

8. The electron-emitting device of claim 6, wherein the electron transferring layer has a varying composition such that a band gap is enlarged in the direction from the semiconductor layer toward the surface layer.

9. The electron-emitting device of claim 6, wherein the surface layer contains aluminum nitride (AlN).

10. The electron-emitting device of claim 6, wherein a region including the electron transferring layer and the surface layer is composed of $Al_xGa_{1-x}N$ ($0 \leqq x \leqq 1$) in which the proportion of Al increases with approach toward the outermost surface.

* * * * *

UNITED STATES PATENT AND TRADEMARK OFFICE

CERTIFICATE OF CORRECTION

PATENT NO. : 6,350,999 B1
DATED : February 26, 2002
INVENTOR(S) : Takeshi Uenoyama et al.

It is certified that error appears in the above-identified patent and that said Letters Patent is hereby corrected as shown below:

Column 27,
Line 20, replace claim 4 as follows:
-- 4. The electron-emitting device of claim 1, wherein a region including the graded composition layer and the surface layer is composed of $A1_xGa_{1-x}N$ $(0 \leqq x \leqq 1)$ in which the proportion of A1 increases with approach toward the outermost surface. --

Signed and Sealed this

Eleventh Day of June, 2002

*Attest:*

JAMES E. ROGAN

*Attesting Officer* *Director of the United States Patent and Trademark Office*